US012642102B2

(12) United States Patent
Seok et al.

(10) Patent No.: US 12,642,102 B2
(45) Date of Patent: May 26, 2026

(54) SEMICONDUCTOR MODULE

(71) Applicant: SAMSUNG ELECTRONICS CO., LTD., Suwon-si (KR)

(72) Inventors: Jong-Hyun Seok, Suwon-si (KR); Dan-Kyu Kang, Suwon-si (KR); Hwanwook Park, Suwon-si (KR); Kang-Gyu Lee, Suwon-si (KR); Jeonghyeon Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 449 days.

(21) Appl. No.: 18/240,576

(22) Filed: Aug. 31, 2023

(65) Prior Publication Data

US 2024/0266305 A1 Aug. 8, 2024

(30) Foreign Application Priority Data

Feb. 2, 2023 (KR) ........................ 10-2023-0014061

(51) Int. Cl.
| | |
|---|---|
| *H01L 23/13* | (2006.01) |
| *H01L 23/498* | (2006.01) |
| *H01L 23/60* | (2006.01) |
| *H01L 25/065* | (2023.01) |

(52) U.S. Cl.
CPC .............. *H01L 23/60* (2013.01); *H01L 23/13* (2013.01); *H01L 23/49811* (2013.01); *H01L 23/49838* (2013.01); *H01L 25/0655* (2013.01)

(58) Field of Classification Search
CPC ... H01L 23/60; H01L 23/13; H01L 23/49811; H01L 23/49838; H01L 25/0655
USPC ........................................................ 365/208
See application file for complete search history.

(56) References Cited

U.S. PATENT DOCUMENTS

| | | | |
|---|---|---|---|
| 5,319,523 | A | 6/1994 | Ganthier et al. |
| 5,692,910 | A | 12/1997 | Mittal |
| 7,529,112 | B2 | 5/2009 | Dreps et al. |
| 8,323,037 | B2 | 12/2012 | Cha et al. |
| 9,618,983 | B2 | 4/2017 | Kim et al. |
| 11,043,246 | B2 | 6/2021 | Lee et al. |
| 2007/0288679 | A1 | 12/2007 | Dreps et al. |
| 2010/0079969 | A1 | 4/2010 | Eguchi et al. |
| 2010/0328835 | A1 | 12/2010 | Shin |
| 2012/0058650 | A1 | 3/2012 | Cha et al. |

(Continued)

FOREIGN PATENT DOCUMENTS

| | | |
|---|---|---|
| JP | 4-249082 A | 9/1992 |
| KR | 10-2007-0057335 A | 6/2007 |

(Continued)

OTHER PUBLICATIONS

Communication issued on Jul. 1, 2024 by the European Patent Office for European Patent Application No. 24154776.9.

*Primary Examiner* — Ly D Pham
(74) *Attorney, Agent, or Firm* — Sughrue Mion, PLLC

(57) ABSTRACT

A semiconductor module includes a board including a chip area and a tab area sequentially arranged in a first direction, a semiconductor chip provided on the chip area, a plurality of signal tabs provided on the tab area, and at least one anti-static portion having conductivity, provided in the tab area, and spaced apart from the plurality of signal tabs, where the plurality of signal tabs and the at least one anti-static portion are sequentially arranged in the first direction and the at least one anti-static portion is disposed on a line extending from at least one of the plurality of signal tabs in the first direction.

20 Claims, 25 Drawing Sheets

(56)             References Cited

U.S. PATENT DOCUMENTS

| | | |
|---|---|---|
| 2013/0017735 A1 | 1/2013 | Luo et al. |
| 2015/0241930 A1 | 8/2015 | Kim et al. |
| 2020/0335139 A1 | 10/2020 | Lee et al. |
| 2020/0363687 A1 | 11/2020 | Tanabe et al. |

FOREIGN PATENT DOCUMENTS

| | | |
|---|---|---|
| KR | 10-2010-0138428 A | 12/2010 |
| KR | 10-1640739 B1 | 7/2016 |

SEMICONDUCTOR MODULE

CROSS-REFERENCE TO RELATED APPLICATION

This application claims priority under 35 U.S.C. § 119 to Korean Patent Application No. 10-2023-0014061, filed on Feb. 2, 2023, in the Korean Intellectual Property Office, the disclosure of which is incorporated by reference herein in its entirety.

BACKGROUND

1. Field

Example embodiments of the disclosure relate to a semiconductor module on which a semiconductor chip is mounted.

2. Description of Related Art

A semiconductor module may include a printed circuit board on which a plurality of semiconductor modules are mounted, and the printed circuit board may be inserted into a socket of a main board and electrically connected to the main board.

However, when the semiconductor module is inserted into the socket, electric charges accumulated in the socket may flow into the semiconductor module, and thus electrostatic discharge may occur. Further, electrical elements and semiconductor chips in the printed circuit board may be directly damaged by such electrostatic discharge.

Accordingly, prevention of electrostatic discharge in the printed circuit board is needed.

SUMMARY

One or more example embodiments provide a semiconductor module in which electrostatic discharge may be prevented.

Additional aspects will be set forth in part in the description which follows and, in part, will be apparent from the description, or may be learned by practice of the presented embodiments.

According to an aspect of an example embodiment, a semiconductor module may include a board including a chip area and a tab area sequentially arranged in a first direction, a semiconductor chip provided on the chip area, a plurality of signal tabs provided on the tab area, and at least one anti-static portion having conductivity, provided in the tab area, and spaced apart from the plurality of signal tabs, where the plurality of signal tabs and the at least one anti-static portion may be sequentially arranged in the first direction and the at least one anti-static portion may be disposed on a line extending from at least one of the plurality of signal tabs in the first direction.

According to an aspect of an example embodiment, a semiconductor module may include a board including a chip area and a tab area arranged in a first direction and at least one notch or at least one protrusion in the tab area, a semiconductor chip provided on the chip area, a plurality of signal tabs provided on the tab area, and an anti-static portion having conductivity, provided in the tab area, and spaced apart from the plurality of signal tabs, where the anti-static portion may be provided either adjacent to the at least one notch or on the at least one protrusion.

According to an aspect of an example embodiment, a semiconductor module may include a board including a chip area and a tab area sequentially arranged in a first direction, a plurality of signal tabs provided on the tab area, and an anti-static portion having conductivity, provided in the tab area and spaced apart from the plurality of signal tabs, where the semiconductor module may be inserted into a socket in the first direction and is connected to a connection pin inside the socket, the plurality of signal tabs and the anti-static portion may be sequentially arranged in the first direction, and the anti-static portion and the plurality of signal tabs may sequentially contact the connection pin upon insertion of the semiconductor module into the socket.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1A:
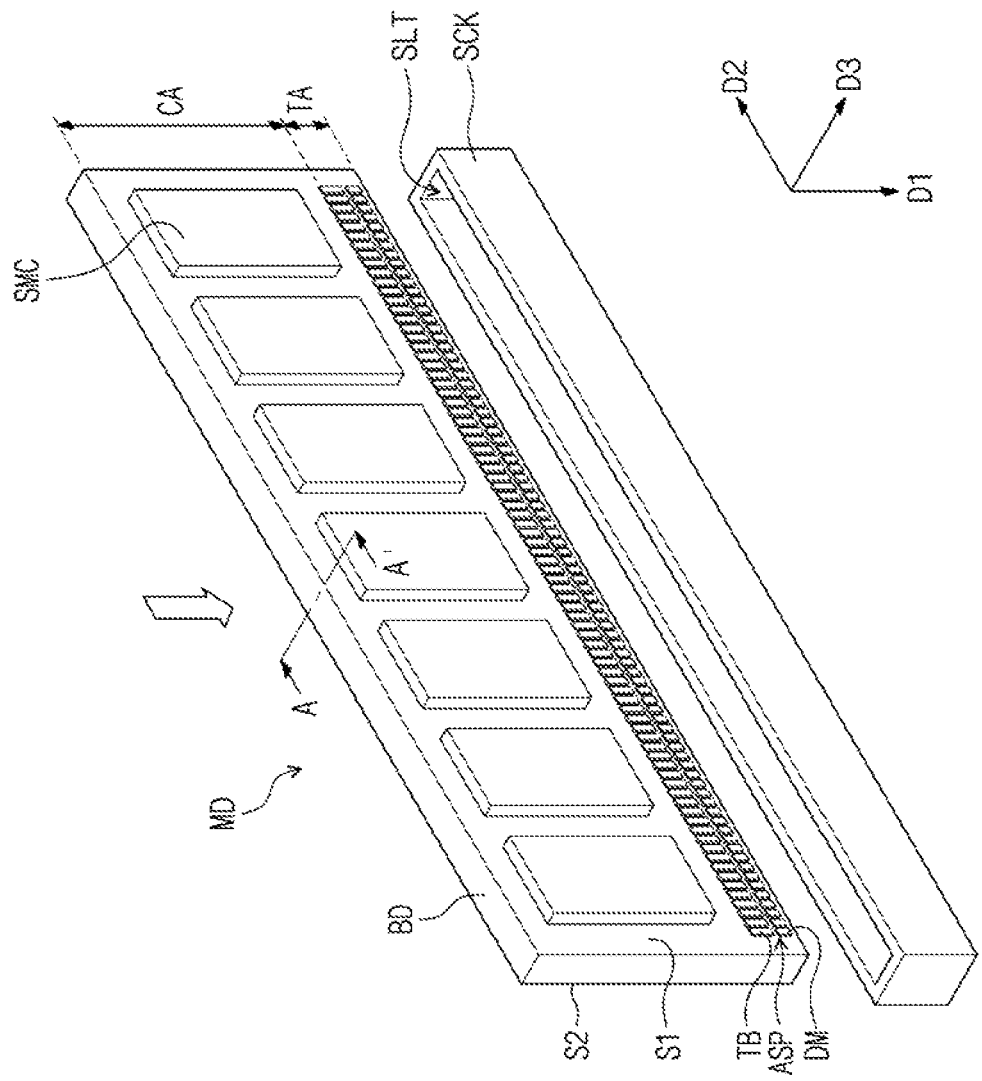
FIG. 1A is a perspective view illustrating a semiconductor device according to an embodiment of the disclosure.

Since the present disclosure may be variously modified and have various forms, an embodiment thereof will be illustrated in the drawings and will herein be described in detail. However, it should be understood that the present disclosure is not limited to a specific disclosure and includes all changes, equivalents, and substitutes included in the spirit and scope of the present disclosure.

In the present specification, when it is mentioned that a first component is positioned on a second component, this may indicate that the first component may be directly formed on the second component or a third component may be interposed therebetween. Further, in the drawings, the thicknesses of components are exaggerated for effective description of technical contents.

Terms used in the present specification are intended to describe an embodiment and are not intended to limit the present disclosure. In the present specification, a singular form also includes a plural form unless specifically mentioned in a phrase. The terms "comprises," "includes," "comprising," and/or "including" used in the specification do not exclude the presence or addition of one or more other components other than the mentioned components.

Hereinafter, example embodiments of the present disclosure will be described in more detail with reference to the accompanying drawings. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1B:
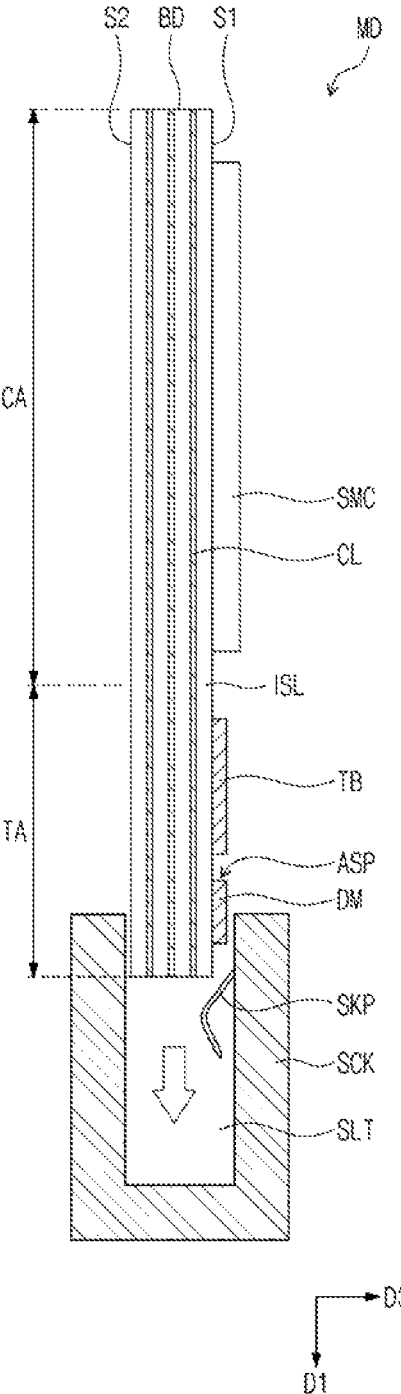
FIG. 1B is a cross-sectional view along line A-A' of FIG. 1A according to an embodiment of the disclosure.
Figure 2A:
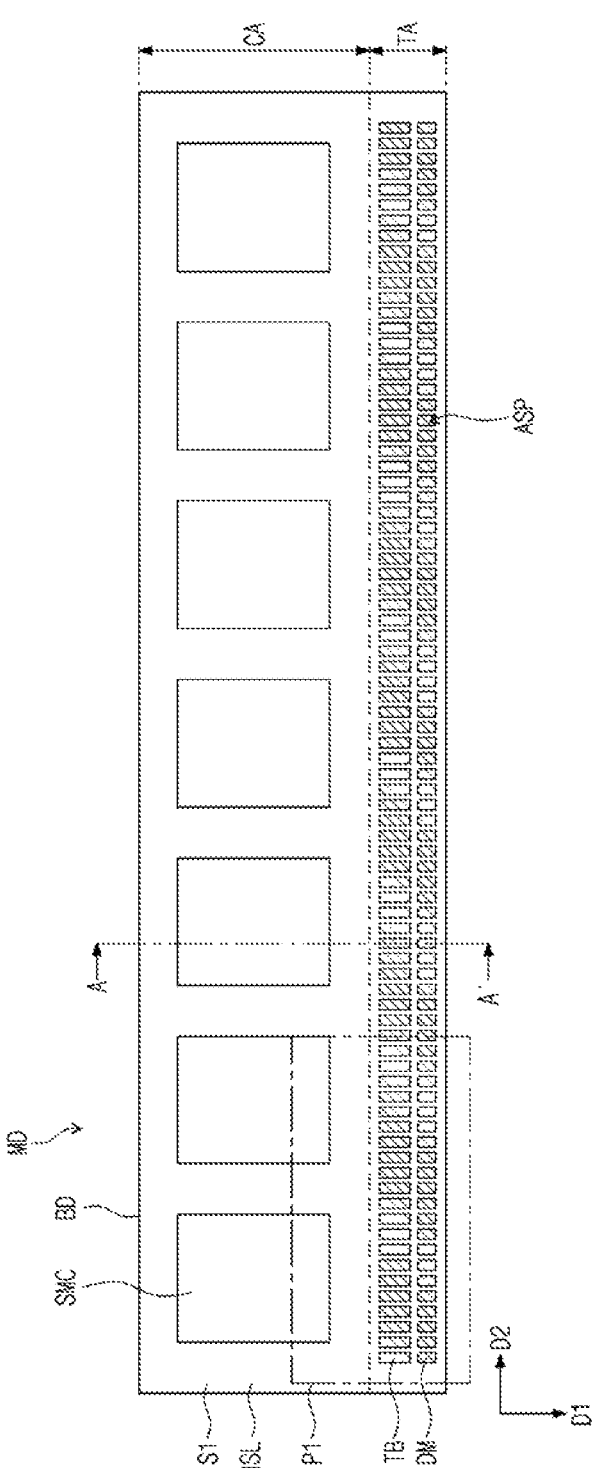
FIG. 2A is a plan view illustrating a semiconductor module of a semiconductor device according to an embodiment of the disclosure.
Figure 2B:
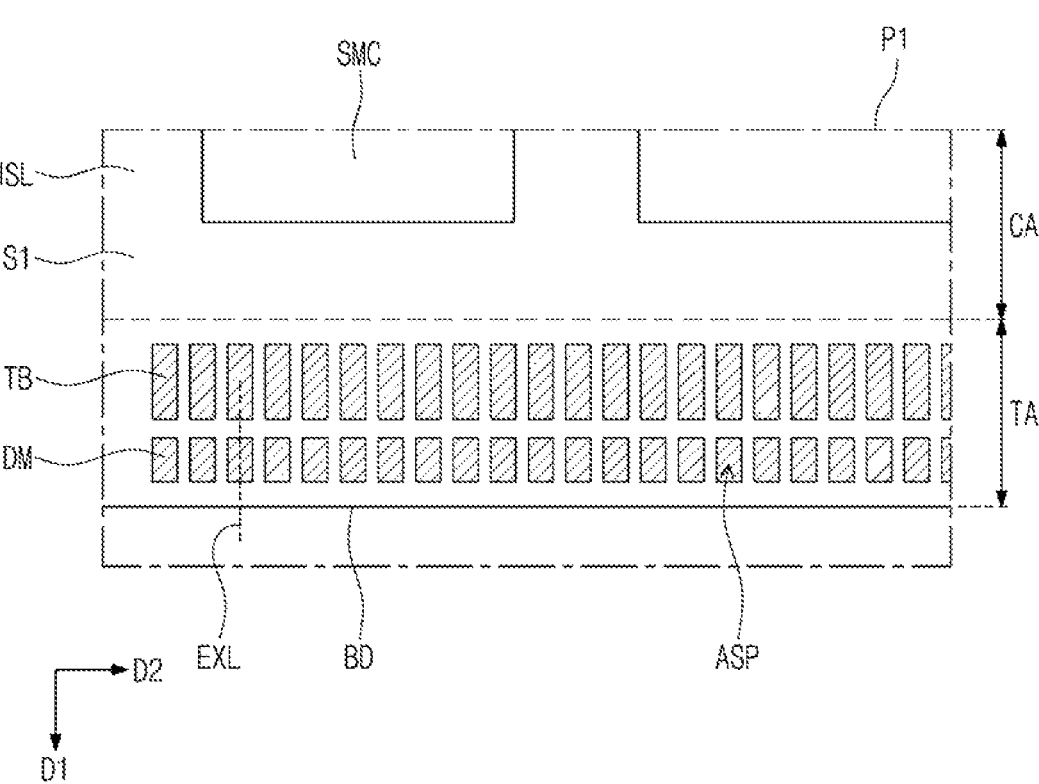
FIG. 2B is an enlarged view of section P1 of FIG. 2A according to an embodiment of the disclosure.

FIG. 1A is a perspective view illustrating a semiconductor device according to an embodiment of the disclosure. FIG. 1B is a cross-sectional view along line A-A' of FIG. 1A according to an embodiment of the disclosure. FIG. 2A is a plan view illustrating a semiconductor module of a semiconductor device according to an embodiment of the disclosure. FIG. 2B is an enlarged view of section P1 of FIG. 2A according to an embodiment of the disclosure.

Referring to FIGS. 1A, 1B, 2A, and 2B, a semiconductor device may include a semiconductor module MD and a socket SCK into which the semiconductor module MD may be inserted.

In an embodiment of the present disclosure, the socket SCK may include a slot SLT in which the semiconductor module MD is accommodated, and the semiconductor module MD may be inserted into the slot SLT. Hereinafter, a direction in which the semiconductor module MD is inserted into the socket SCK may be referred to as a first direction D1, a direction which is perpendicular to the first direction D1 and in which the semiconductor module MD extends may be referred to as a second direction D2, and a direction perpendicular to both the first direction D1 and the second direction D2 may be referred to as a third direction D3.

The semiconductor module MD may include a board BD at least one semiconductor chip SMC mounted on the board BD, signal tabs TB for transmitting signals, and an anti-static portion ASP for preventing electrostatic discharge.

The socket SCK includes the slot SLT that extends in the second direction D2 and may have an empty inner space such that an inserted portion of the semiconductor module MD may be accommodated therein when one side of the semiconductor module MD is inserted. The slot SLT may have a structure corresponding to a structure of the semiconductor module MD. Connection pins SKP to be electrically connected to the semiconductor module MD may be provided in the slot SLT.

In an embodiment of the present disclosure, the connection pins SKP may be provided in one-to-one correspondence with the signal tabs TB, respectively, but the present disclosure is not limited thereto. When the semiconductor module MD is completely inserted into the slot SLT of the socket SCK, the connection pins SKP may directly contact the signal tabs TB and thus may be electrically connected to the signal tabs TB. As a result, when the semiconductor module MD is inserted into the slot SLT, an electrical signal may be transmitted or received from an external electronic element to the semiconductor chip SMC or from the semiconductor chip SMC to the external electronic element. In this case, one side of each of signal tabs TB may be electrically connected to the connection pins SKP of the socket SCK, and the other side thereof may be directly/indirectly and electrically connected to circuit wiring lines CL of the board BD.

The board BD may be provided in a plate shape having a first surface S1 and a second surface S2 opposite to the first surface S1. The board BD may include a chip area CA in which the semiconductor chip SMC is provided and a tab area TA in which the signal tabs TB are provided. The chip area CA and the tab area TA may be sequentially arranged in the first direction D1.

The semiconductor chip SMC, the signal tabs TB, and the anti-static portion ASP may be provided on at least one surface among the first surface S1 and the second surface S2 of the board BD. In an embodiment of the present disclosure, for convenience of description, a case in which the semiconductor chip SMC, the signal tabs TB, and the anti-static portion ASP are provided on the first surface S1 will be described as an example. However, the present disclosure is not limited thereto, and the semiconductor chip SMC, the signal tabs TB, and the anti-static portion ASP may be provided on both the first surface S1 and the second surface S2.

The board BD may be provided in various shapes and may have, for example, a rectangular shape extending in a direction perpendicular to the first direction D1.

The board BD may be a printed circuit board (PCB). The board BD may include internal and external circuits and/or connection wiring lines (hereinafter, referred to as circuit wiring lines CL) for connecting the circuits. The circuit wiring lines CL may be provided on the first surface S1 and/or the second surface S2 and may be provided in a single layer or multiple layers even inside a space between the first surface S1 and the second surface S2. In an embodiment of the present disclosure, the board BD may include at least one conductive layer therein, and at least a portion of the conductive layer may constitute the circuit wiring lines CL. A case in which the conductive layer corresponds to the circuit wiring lines CL is illustrated as an example, and when the circuit wiring lines CL are provided inside the space between the first surface S1 and the second surface S2, the circuit wiring lines CL may be arranged with an insulating layer ISL interposed therebetween. When the circuit wiring lines CL are arranged with the insulating layer ISL interposed therebetween, wiring lines arranged on different layers may be connected in various manners through a plurality of through vias. Hereinafter, in the drawings, for convenience of description, it is illustrated that the circuit wiring line CL is provided in three layers inside the board BD. However, the conductive layer is not limited thereto, and may be provided in various shapes without a function of transmitting a signal as needed as well as the circuit wiring lines CL for transmitting signals.

The board BD may be made by coating a copper foil on a plate obtained by compressing various polymers such as phenol or epoxy resin in a certain thickness. The copper foil is patterned to form the circuit wiring line CL. An electronic component, for example, a memory chip, may be mounted on the circuit wiring line CL by being connected to the circuit wiring line CL through a bump. The board BD may be classified into a single layer PCB in which wiring lines are formed only on one side and a double layer PCB in which wiring lines are formed on both sides. Further, as illustrated, the number of layers of the circuit wiring line CL may be three or more with insulating layers ISL disposed therebetween, and three or more circuit wiring lines CL may be formed on the board BD according to the number of layers of the formed circuit wiring line CL.

The semiconductor chip SMC is mounted on the chip area CA. The semiconductor chip SMC may be provided on the chip area CA in various sizes, various shapes, and various numbers.

A plurality of semiconductor chips SMC may be mounted on the semiconductor module MD according to an embodiment of the present disclosure. The semiconductor chip SMC is a memory chip, and a dynamic random access memory (RAM) (DRAM) or a magnetic RAM (MRAM) may be used as a main memory of a memory system. In the case of the DRAM, a plurality of semiconductor memory chips may be mounted on one board BD to constitute one memory module to increase a memory size, and the memory module may be roughly classified into a single in-line memory module (SIMM) and a dual in-line memory module (DIMM). The SIMM may refer to an early memory module and may have a structure in which pins are formed only one side of the PCB. On the other hand, in the DIMM, pins may be formed on both sides of the PCB.

The semiconductor chips SMC may be mounted on the one surface or both surfaces of the PCB of both the SIMM and DIMM. However, due to characteristics of the structure, in the case of the SIMM, the memory chips may be generally mounted on the one surface of the PCB, and in the case of the DIMM, the memory chips may be generally mounted on both surfaces of the PCB.

When the semiconductor chip SMC mounted on the board BD is a memory chip, the semiconductor chip SMC may include at least one of the DRAM, a static RAM (SRAM), a flash memory, an electrically erasable programmable read-only memory (EEPROM), a phase change RAM (PRAM), the MRAM, and a resistive RAM (RRAM).

The semiconductor chip SMC may be mounted on one surface of the board BD as described above or mounted on both surfaces thereof. Further, although it is illustrated in the drawings that seven semiconductor chips SMC are mounted, the number of the mounted semiconductor chips SMC is not limited to seven and various numbers of semiconductor chips may be mounted. For example, 8 or 16 semiconductor chips SMC may be mounted on the board BD. Although it is illustrated in the drawings that the semiconductor chip SMC has a quadrangular shape, the semiconductor chip SMC may not be mounted on the board in a bare chip form but may be mounted on the board in a package form.

The tab area TA may be provided with the plurality of signal tabs TB and the anti-static portion ASP.

The signal tabs TB may be arranged to be spaced apart from each other in the second direction D2. The signal tabs TB may be formed in various shapes and sizes to directly contact the connection pins SKP of the socket SCK, which will be described below, and as an example, each of the signal tabs TB may have a rectangular shape extending in the first direction D1.

Each of the signal tabs TB may be made of a conductive material (e.g., a metal such as copper or gold) and may be formed on the first surface S1 using various methods (e.g., electrolytic plating and electroless plating).

The signal tabs TB may be electrically connected to the semiconductor chip SMC through the circuit wiring lines CL formed on the board BD, and may receive or transmit signals from or to the semiconductor chips SMC. Through the signal tabs TB, a signal may be transmitted from the semiconductor chip SMC to other external electronic element or from the other external electronic element to the semiconductor chip SMC.

In an embodiment of the present disclosure, although the plurality of signal tabs TB arranged in one column in the second direction D2 are illustrated, this is for convenience of description, and the present disclosure is not limited thereto. In an embodiment of the present disclosure, two columns of the signal tabs TB may be arranged in the second direction D2. In this case, one column of the connection pins SKP corresponding to the two columns of the signal tabs TB may be installed in the socket SCK.

The anti-static portion ASP may be configured to prevent the electrostatic discharge that may occur in the board BD when the semiconductor module MD is inserted into the socket SCK and may be provided in the tab area TA of the board BD. The anti-static portion ASP may be made of a conductive material such that the anti-static portion ASP serves as a passage of charges. The anti-static portion ASP may be provided at a position at which the connection pin SKP inside the socket SCK may first contact the anti-static portion ASP when the semiconductor module MD is inserted into the socket SCK. The anti-static portion ASP may be made of a conductive material, and accordingly, when the connection pin SKP of the socket SCK contacts the anti-static portion ASP, electric charges are moved or discharged toward the anti-static portion ASP, and thus the electrostatic discharge may be reduced or prevented.

The anti-static portion ASP may be provided in a floating state and/or may be connected to the ground to minimize the electrostatic discharge. In particular, at least a portion of the anti-static portion ASP may be connected to a predetermined circuit such that a ground potential is applied thereto.

In an embodiment of the present disclosure, when the semiconductor module MD is inserted into the socket SCK, the anti-static portion ASP and the signal tabs TB may sequentially contact the connection pin SKP inside the socket SCK, and thus the electrostatic discharge may be prevented through the anti-static portion ASP. After the semiconductor module MD is inserted into the socket SCK, the connection pins SKP may contact the signal tabs TB, and the anti-static portion ASP may be spaced apart from the connection pins SKP while not contacting the connection pins SKP.

In an embodiment of the present disclosure, the anti-static portion ASP may be provided in various structures such that the anti-static portion ASP first contacts the connection pin SKP before the signal tabs TB and thus accumulated charges may be drained. For example, the anti-static portion ASP may be provided near the signal tabs TB in a similar form to the signal tabs TB. The anti-static portion ASP may be provided in a form in which a portion of the board BD is removed such that an internal conductive circuit wiring line CL is exposed, or may be provided in a form in which a separate conductive material is mounted.

Hereinafter, a detailed example of the anti-static portion ASP according to an embodiment of the present disclosure will be described.

Referring to FIGS. 1B, 2A, and 2B, as the semiconductor module MD may include a plurality of anti-static portions ASP which may include dummy patterns DM arranged in the second direction D2. The dummy patterns DM may be provided between the signal tabs TB and an edge positioned on one side in a direction in which the semiconductor module MD is inserted. Unlike the signal tabs TB for transmitting signals, the dummy patterns DM may float or may be connected to a ground.

In an embodiment of the present disclosure, the dummy patterns DM may be provided to correspond to the signal tabs TB, respectively, and thus may be provided between the signal tabs TB and the edge. As an example, when viewing one signal tab TB, the dummy pattern DM is disposed on an extension line EXL extending from the signal tab TB in the first direction D1 such that the dummy pattern DM first contacts the connection pin SKP inside the socket SCK when the semiconductor module MD is inserted into the socket SCK and the signal tab TB then sequentially contacts the connection pin SKP. After the semiconductor module MD is completely inserted into the socket SCK, the dummy pattern DM may be separated and spaced apart from the connection pin SKP.

In an embodiment of the present disclosure, the dummy patterns DM may be formed on the first surface S1 of the board BD and may be made of a conductive material, for example, a metal material such as copper or gold. The dummy patterns DM may be made of the same material as that of the signal tabs TB. In this case, the dummy patterns DM may be formed in the same process as a process of forming the signal tabs TB, and for example, the dummy patterns DM may be formed on the board BD using electrolytic plating, electroless plating or the like. However, the method of forming the dummy patterns DM is not limited thereto, and when the semiconductor module MD is manufactured, the dummy patterns DM may be formed through a separate process that is different from a process of forming other components.

In this way, as described above, damage to the semiconductor chip SMC, the circuit and/or the wiring lines caused by the electrostatic discharge which may occur when the semiconductor module MD is inserted into the socket SCK may be prevented when the anti-static portion ASP is formed in the semiconductor module MD.

In the related art, when a semiconductor module is inserted into a socket, charges accumulated inside the socket may rapidly flow through a signal tab which is a conductor that first contacts a connection pin and are discharged inside the semiconductor module. Such electrostatic discharge may cause fatal defects in electronic components in the semiconductor module. Thus, example embodiments of present disclosure provides the anti-static portion ASP (e.g., including the dummy pattern DM) as a passage through which the accumulated charges may be separately discharged before the signal tabs TB contact the connection pin SKP, and thus the accumulated charges may be discharged to the dummy pattern DM. Further, the dummy pattern DM may be grounded. In this case, the accumulated charges are discharged through the grounded dummy pattern DM. Further, since the connection pin SKP and the signal tabs TB contact each other after the charges accumulated in the socket SCK are discharged, physical damage to the semiconductor chip SMC, the circuit, the circuit wiring line CL, and the like in the semiconductor module MD due to the electrostatic discharge is prevented.

In an embodiment of the present disclosure, the anti-static portion ASP that includes the dummy pattern DM may be provided on the same line as a passage in which the signal tabs TB are inserted into the socket SCK on a surface on which the signal tabs TB are provided. Accordingly, even in abnormal socketing such as insertion into the socket SCK in an inclined state, the anti-static portion ASP may contact the connection pin SKP before the signal tabs TB. Accordingly, even in the abnormal socketing, the electrostatic discharge in the semiconductor module MD may be prevented.

In an embodiment of the present disclosure, the anti-static portion ASP may be provided in various shapes.

Figure 3A:
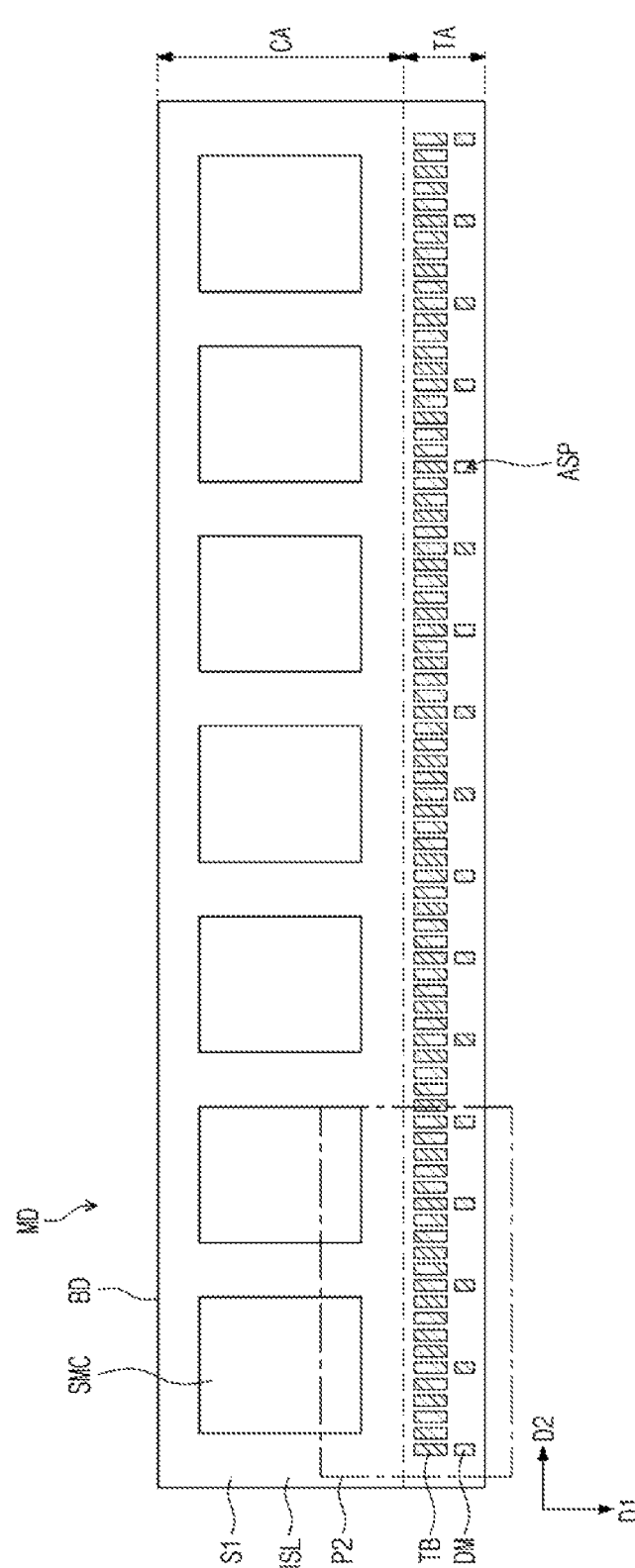
FIG. 3A is a plan view illustrating a semiconductor module according to an embodiment of the disclosure.
Figure 3B:
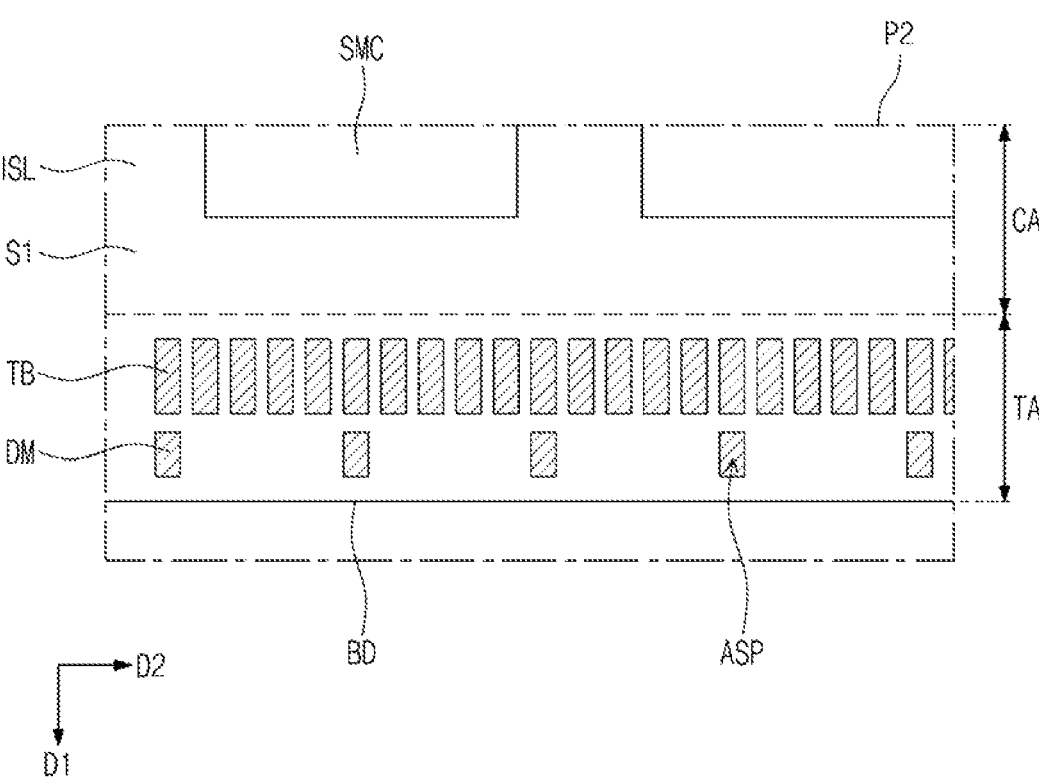
FIG. 3B is an enlarged view of section P2 of FIG. 3A according to an embodiment of the disclosure.

FIG. 3A is a plan view illustrating a semiconductor module according to an embodiment of the disclosure. FIG. 3B is an enlarged view of section P2 of FIG. 3A according to an embodiment of the disclosure. Descriptions of aspects similar to those described above may be omitted.

Referring to FIGS. 3A and 3B, the dummy patterns DM may be provided as the anti-static portion ASP according to an embodiment of the present disclosure, and the dummy patterns DM may not be provided to all the signal tabs TB, respectively, but may be provided to correspond to only some of the signal tabs TB. Even in this case, the dummy patterns DM may be arranged in the second direction D2 in the same shape as an arrangement direction of the signal tabs TB. When the semiconductor module MD is inserted into the socket SCK, the dummy patterns DM may be provided on the same line as a path in which some signal tabs TB are inserted into the socket SCK.

In an embodiment of the present disclosure, it is shown that one dummy pattern DM is provided for every five signal tabs TB, but the present disclosure is not limited thereto. Further, it is shown in an embodiment that the dummy patterns DM are provided at regular intervals, but the present disclosure is not limited thereto, and an interval at which the dummy patterns DM are arranged may be also differently defined. A larger number of dummy patterns DM may be provided at a position at which the electrostatic discharge frequently occurs. For example, in the semiconductor module MD, when a large amount of electrostatic discharge occurs in a center portion, a larger number of dummy patterns DM may be provided in the center portion, and a smaller number of dummy patterns DM at an edge portion than the number of dummy patterns DM in the center portion may be provided.

According to an embodiment of the present disclosure, the dummy patterns DM as the anti-static portion ASP may be provided in a form extending long in one direction.

Figure 4A:
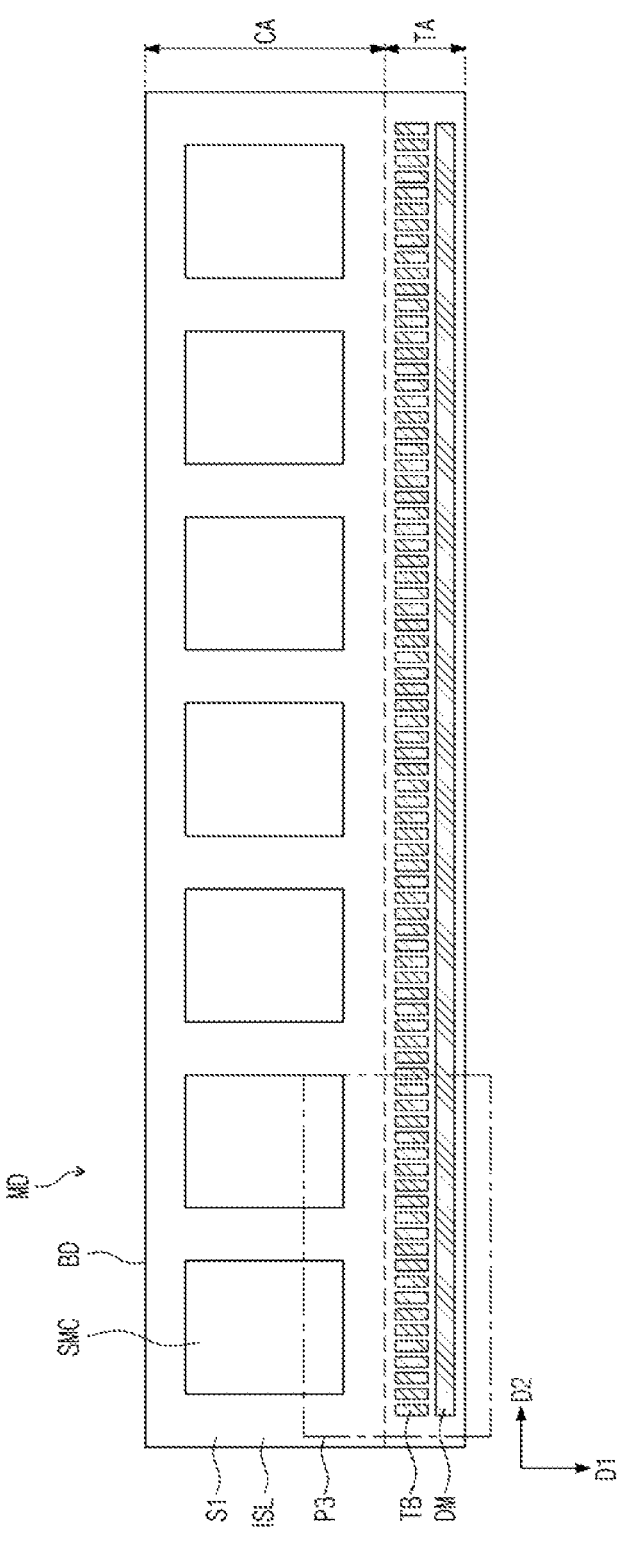
FIG. 4A is a plan view illustrating a semiconductor module according to an embodiment of the disclosure.
Figure 4B:
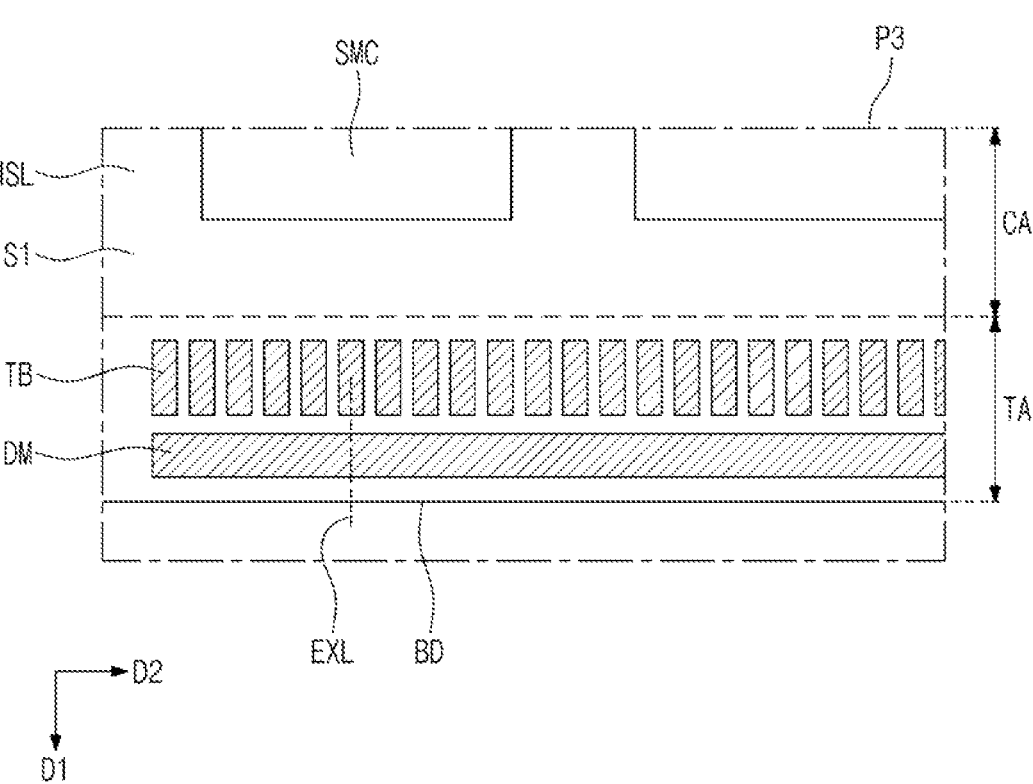
FIG. 4B is an enlarged view of section P3 of FIG. 4A according to an embodiment of the disclosure.

FIG. 4A is a plan view illustrating a semiconductor module according to an embodiment of the disclosure. FIG. 4B is an enlarged view of section P3 of FIG. 4A according to an embodiment of the disclosure.

Referring to FIGS. 4A and 4B, the anti-static portion ASP may include the dummy pattern DM and may be provided in a bar shape extending long in the second direction D2.

When the semiconductor module MD is inserted into the socket SCK, the bar-shaped dummy patterns DM may be provided on the path in which some signal tabs TB are inserted into the socket SCK.

In an embodiment of the present disclosure, it is illustrated that one bar-shaped dummy pattern DM is provided between the signal tabs TB and the edge, but the present disclosure is not limited thereto. For example, when the dummy pattern DM has a bar shape extending in the second direction D2, the bar-shaped dummy pattern DM may correspond to the entire edges at which the signal tabs TB are provided or may correspond only to edges corresponding to some of the signal tabs TB. Further, the semiconductor module MD may include a plurality of bar-shaped dummy patterns DM. Further, when a plurality of bar-shaped dummy patterns DM are provided, lengths of the bar-shaped dummy patterns DM in the second direction D2 may be the same or different. Further, an interval at which the bar-shaped dummy patterns DM are arranged as well as the lengths of the bar-shaped dummy patterns DM may be also differently defined. The dummy patterns DM may be provided to have a longer length and a narrower interval at a position in which the electrostatic discharge frequently occurs. For example, in the semiconductor module MD, when the electrostatic discharge frequently occurs in the center portion, the bar-shaped dummy pattern DM at the center portion may be provided in a long length, and the bar-shaped dummy pattern DM at the edge portion may be provided in a short length and a wide interval.

According to an embodiment of the present disclosure, the dummy patterns DM may be arranged in a form corresponding to the shape of the board according to the shape of the board.

Figure 5A:
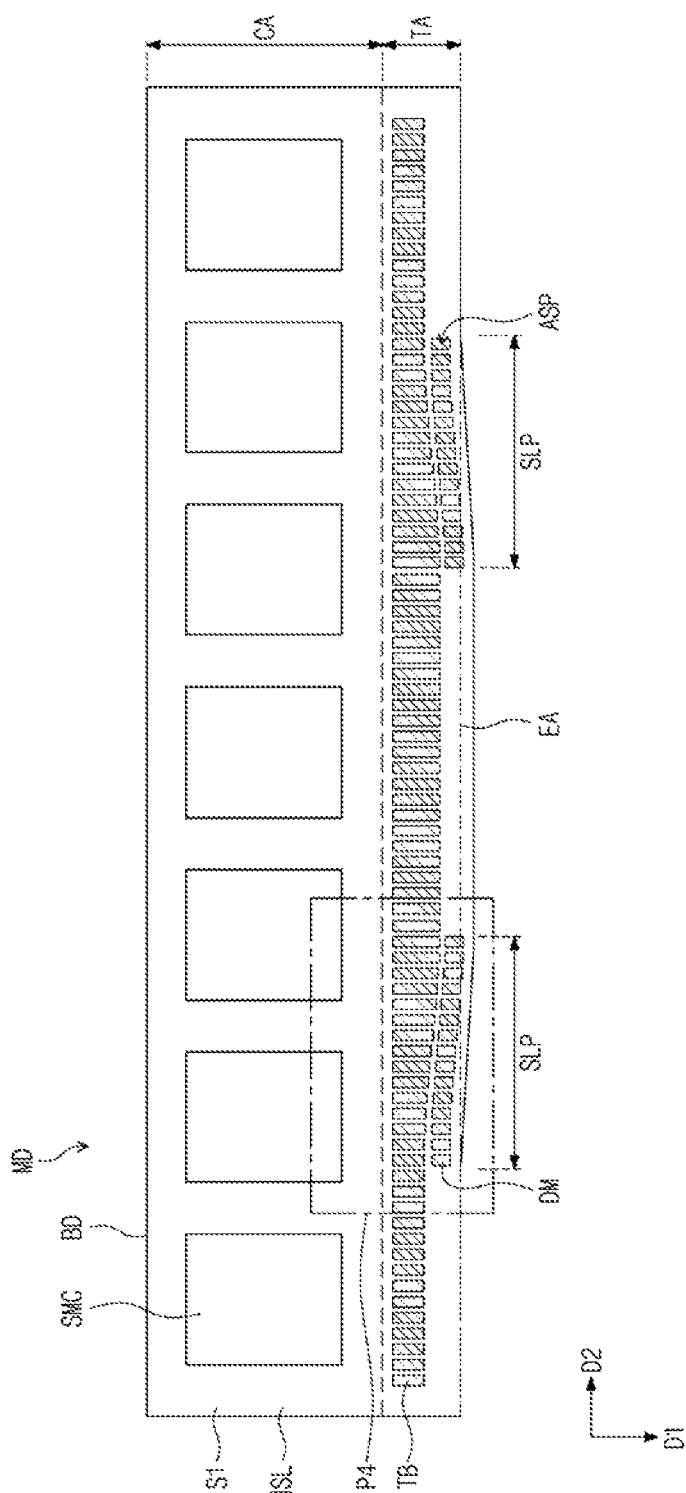
FIG. 5A is a plan view illustrating a semiconductor module according to an embodiment of the disclosure.
Figure 5B:
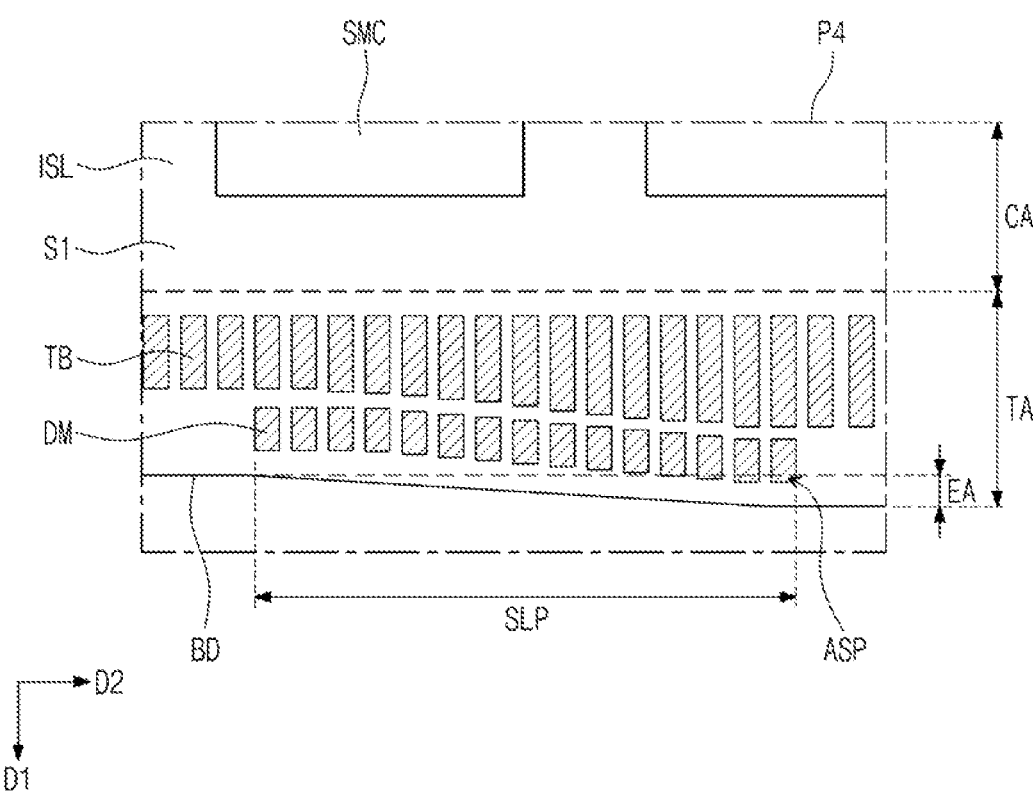
FIG. 5B is an enlarged view of section P4 of FIG. 5A according to an embodiment of the disclosure.

FIG. 5A is a plan view illustrating a semiconductor module according to an embodiment of the disclosure. FIG. 5B is an enlarged view of section P4 of FIG. 5A according to an embodiment of the disclosure.

Referring to FIGS. 5A and 5B, the board BD may have a substantially rectangular shape and may include an area extending in the first direction D1. For example, the board BD may include an extension area EA in which a center portion of the tab area TA extends in the first direction D1 and protrudes outward. The extension area EA may correspond to a protruding portion inserted into the socket SCK before the edge of the semiconductor module MD is inserted into the socket SCK. The extension area EA may include an inclined portion SLP of which an edge is inclined with respect to the second direction D2.

In an embodiment of the present disclosure, the signal tabs TB and the anti-static portion ASP may have different shapes or different arrangement positions for each area according to the shape of the board BD. For example, as illustrated, the anti-static portion ASP may include a plurality of dummy patterns DM, have at least a portion formed in the extension area EA of the board BD, and may be inclined along the inclined portion SLP of the extension area EA.

In an embodiment of the present disclosure, the lengths of the signal tabs TB and the dummy patterns DM may be variously combined at a center portion of the board BD in which the extension area EA is provided, particularly, in an area in which the inclined portion SLP is provided. For example, the lengths of the signal tabs TB may gradually increase or decrease in the second direction D2 to correspond to an inclination of the inclined portion SLP. In this case, the lengths of the plurality of dummy patterns DM may be the same. Further, all the lengths of the signal tabs TB are the same, but the lengths of the dummy patterns DM may gradually increase or decrease in the second direction D2 to correspond to the inclination of the inclined portion SLP.

In an embodiment of the present disclosure, when the extension area EA having the inclined portion SLP is provided, the anti-static portion ASP may be provided in an area corresponding to the inclined portion SLP. Since the extension area EA is a portion contacting the connection pin SKP of the socket SCK before the edge of the semiconductor module MD when the semiconductor module MD is inserted into the socket SCK, the electrostatic discharge may occur more frequently than other areas. In an embodiment, the anti-static portion ASP may be formed in an area corresponding to the inclined portion SLP, and thus the electrostatic discharge may be efficiently prevented.

According to an embodiment of the present disclosure, the anti-static portion may be provided not only at positions corresponding to the signal tabs but also at positions in which the signal tabs are not provided. The anti-static portion ASP may be a portion that contacts the connection pins before the signal tabs contact the connection pins when the semiconductor module is inserted into the socket and thus may discharge the charges accumulated in the socket. In this case, a conductor (for example, a fastening pin) other than the connection pins may be used.

Figure 6A:
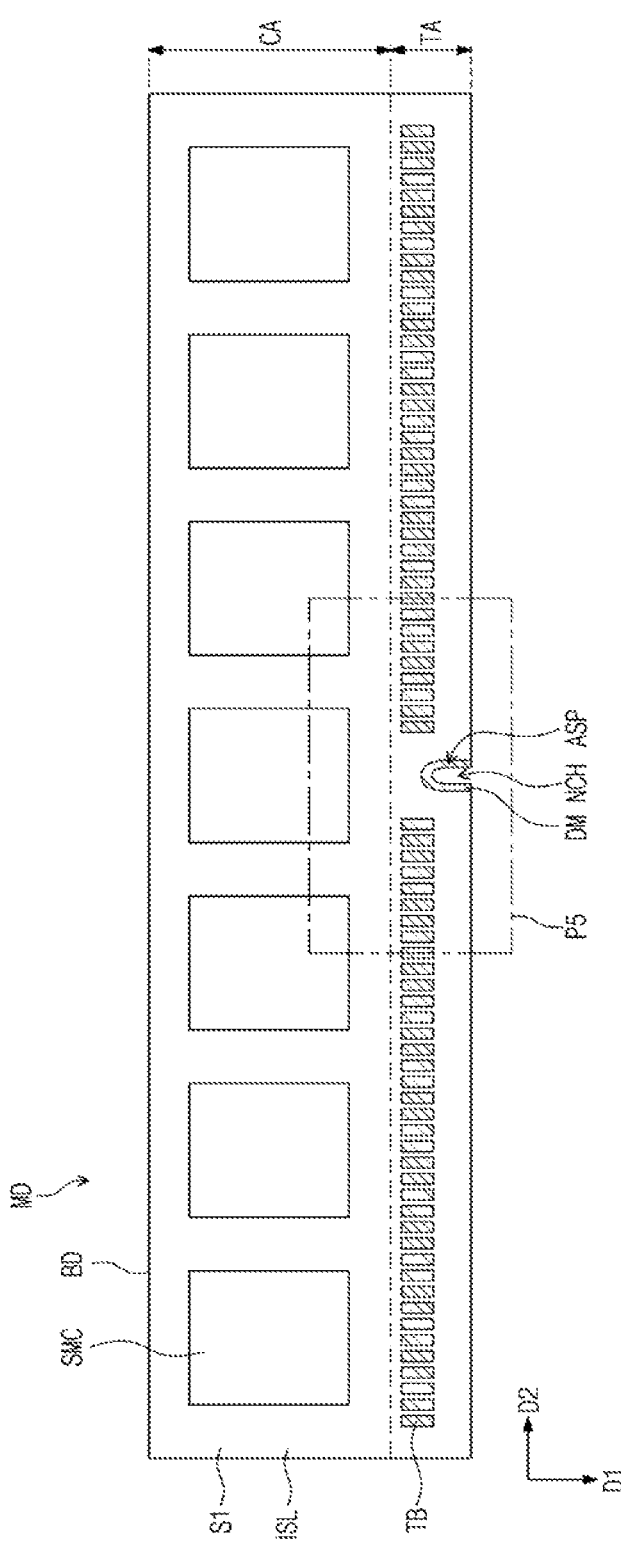
FIG. 6A is a plan view illustrating a semiconductor module according to an embodiment of the disclosure.
Figure 6B:
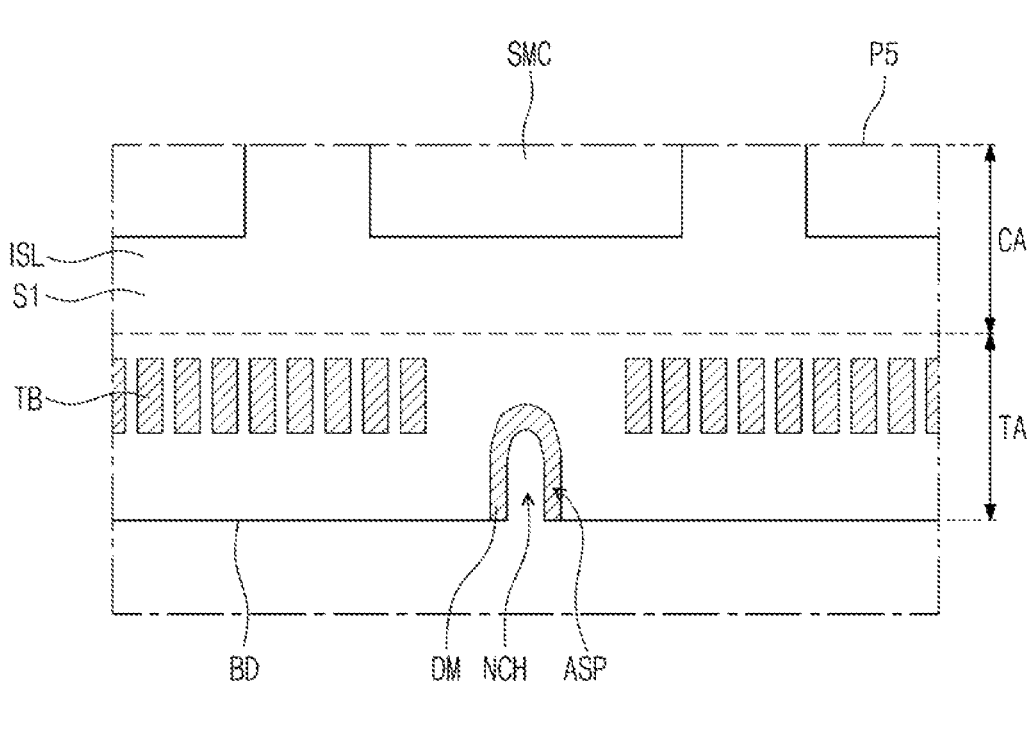
FIG. 6B is an enlarged view of section P5 of FIG. 6A according to an embodiment of the disclosure.
Figure 6B:
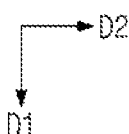

FIG. 6A is a plan view illustrating a semiconductor module according to an embodiment of the disclosure. FIG. 6B is an enlarged view of section P5 of FIG. 6A according to an embodiment of the disclosure.

Referring to FIGS. 6A and 6B, in the semiconductor module MD according to an embodiment of the present disclosure, a notch NCH recessed inward from the edge may be provided in the tab area TA of the board BD. The anti-static portion ASP may be provided along an edge of the notch NCH.

The notch NCH may be provided at a predetermined position to prevent erroneous insertion of the semiconductor module MD. The notches NCH may be provided at different positions, and fastening pins may be provided at such positions, respectively. Accordingly, a matching semiconductor module MD may be inserted only into a matching socket SCK.

For example, as illustrated, the notch NCH may be provided at an edge of the center portion at the insertion side, and the signal tabs TB may not be provided at the portion at which the notch NCH is formed. However, the position of the notch NCH is not limited thereto and may be provided at other positions according to the semiconductor module MD.

The anti-static portion ASP may be provided in the form of the dummy pattern DM along a circumference of the notch NCH to be adjacent to the notch NCH. The dummy pattern DM formed in the circumference of the notch NCH may also made of a conductive material (e.g., a metal material such as copper or gold) on the first surface S1 of the board BD. The dummy pattern DM may be made of the same material as that of the signal tabs TB. In this case, the dummy pattern DM may be formed in the same process as a process of forming the signal tabs TB, and for example, the dummy pattern DM may be formed on the board BD using electrolytic plating, electroless plating or the like. However, the method of forming the dummy pattern DM is not limited thereto, and when the semiconductor module MD is manufactured, the dummy pattern DM may be formed through a separate process that is different from a process of forming other components.

When the semiconductor module MD is inserted into the socket SCK, the dummy pattern DM may first contact the fastening pin inside the socket SCK. When the semiconductor module MD is completely inserted, the signal tabs TB may contact the connection pin SKP. Accordingly, the accumulated charges are discharged through the fastening pin when the dummy pattern DM adjacent to the notch NCH first contacts the fastening pin. Accordingly, the electrostatic discharge in the semiconductor module MD is prevented.

In an embodiment of the present disclosure, the dummy pattern may be provided in the form of a protruding protrusion rather than a notch recessed from the edge.

Figure 7A:
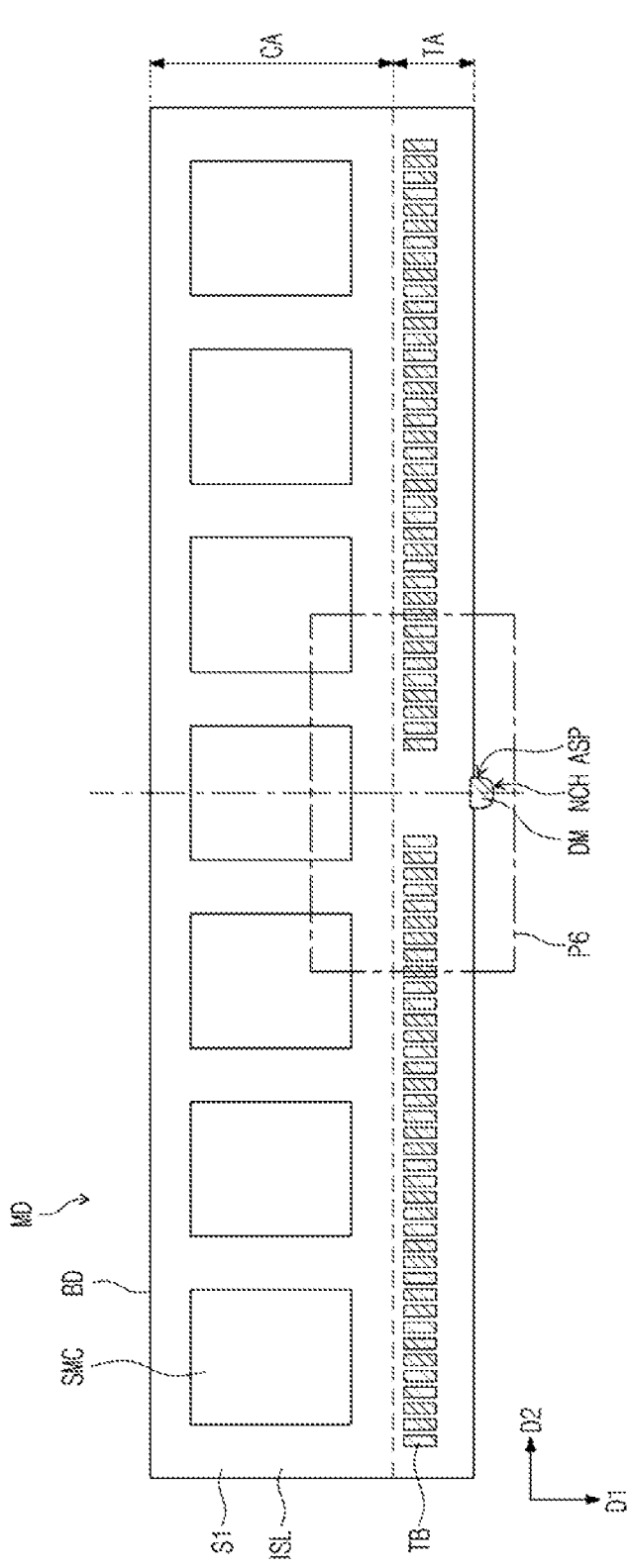
FIG. 7A is a plan view illustrating a semiconductor module according to an embodiment of the disclosure.
Figure 7B:
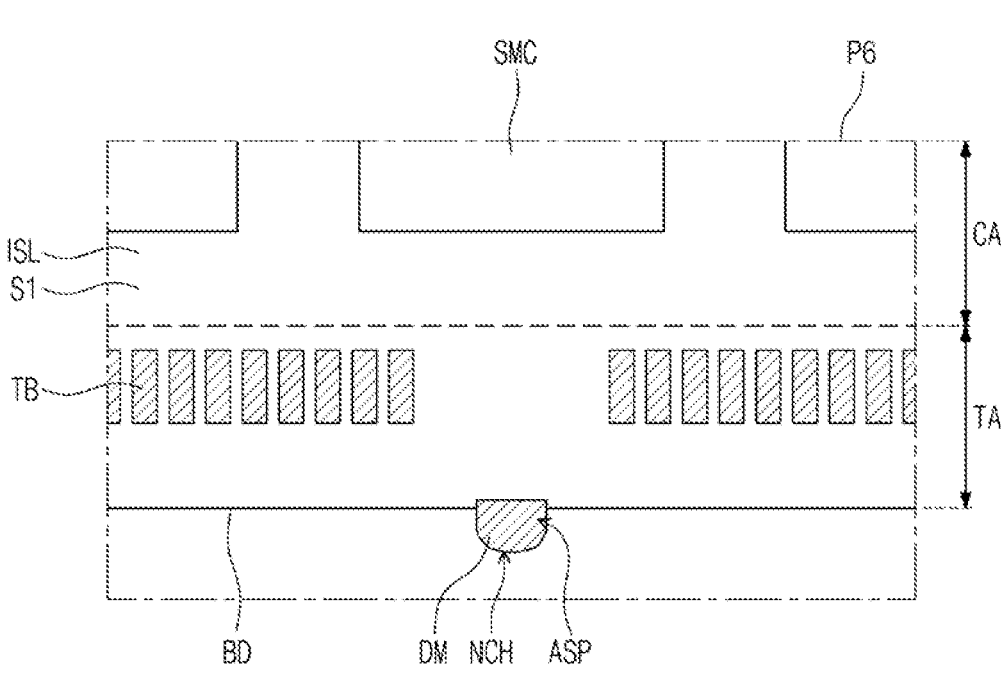
FIG. 7B is an enlarged view of section P6 of FIG. 7A according to an embodiment of the disclosure.
Figure 7B:
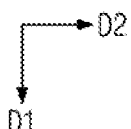

FIG. 7A is a plan view illustrating a semiconductor module according to an embodiment of the disclosure. FIG. 7B is an enlarged view of section P6 of FIG. 7A according to an embodiment of the disclosure.

Referring to FIGS. 7A and 7B, a protrusion PRT protruding outward from the edge may be provided in the tab area TA of the board BD. The protrusion PRT may be provided in the anti-static portion ASP.

Like the notch NCH, the protrusion PRT may be provided at a predetermined position to prevent erroneous insertion of the semiconductor module MD. The protrusions PRT may be provided at different positions. A matching semiconductor module MD may be provided with the fastening pins at positions corresponding to the different positions such that the matching semiconductor module MD may be inserted only into a matching socket SCK.

For example, as illustrated, the protrusion PRT may be provided in the center at the insertion side. The signal tabs TB may not be provided in the portion of the board BD in which the protrusion PRT is formed. The position of the protrusion PRT is not limited thereto, and the protrusion PRT may be provided at different positions according to the semiconductor module MD.

The dummy pattern DM (i.e., the anti-static portion ASP) may be provided in the form that covers or at least partially covers at least a portion of the protrusion PRT on the portion in which the protrusion PRT is formed. The dummy pattern DM formed on the protrusion PRT may also made of a conductive material (e.g., a metal material such as copper or gold) on the first surface S1 of the board BD. The dummy pattern DM may be made of the same material as that of the signal tabs TB. In this case, the dummy pattern DM may be formed in the same process as a process of forming the signal tabs TB, and for example, the dummy pattern DM may be formed on the board BD using electrolytic plating, electroless plating or the like. However, the method of forming the dummy pattern DM is not limited thereto, and when the semiconductor module MD is manufactured, the dummy pattern DM may be formed through a process that is different from a process of forming other components.

When the semiconductor module MD is inserted into the socket SCK, the dummy pattern DM may first contact the fastening pin inside the socket SCK. After the semiconductor module MD is completely inserted, the signal tabs TB may contact the connection pin SKP. Accordingly, the accumulated charges are discharged through the fastening pin when the dummy pattern DM on the protrusion PRT contacts the fastening pin. Accordingly, the electrostatic discharge in the semiconductor module MD may be prevented.

In an embodiment of the present disclosure, the above embodiments describe that the anti-static portion is formed such that the dummy pattern made of a conductive material is provided on the first surface of the board. However, the present disclosure is not limited thereto, and the anti-static portion may be formed such that an opening is formed by removing a portion of the board and thus a portion of a conductive layer made of a conductive material is exposed.

Figure 8A:
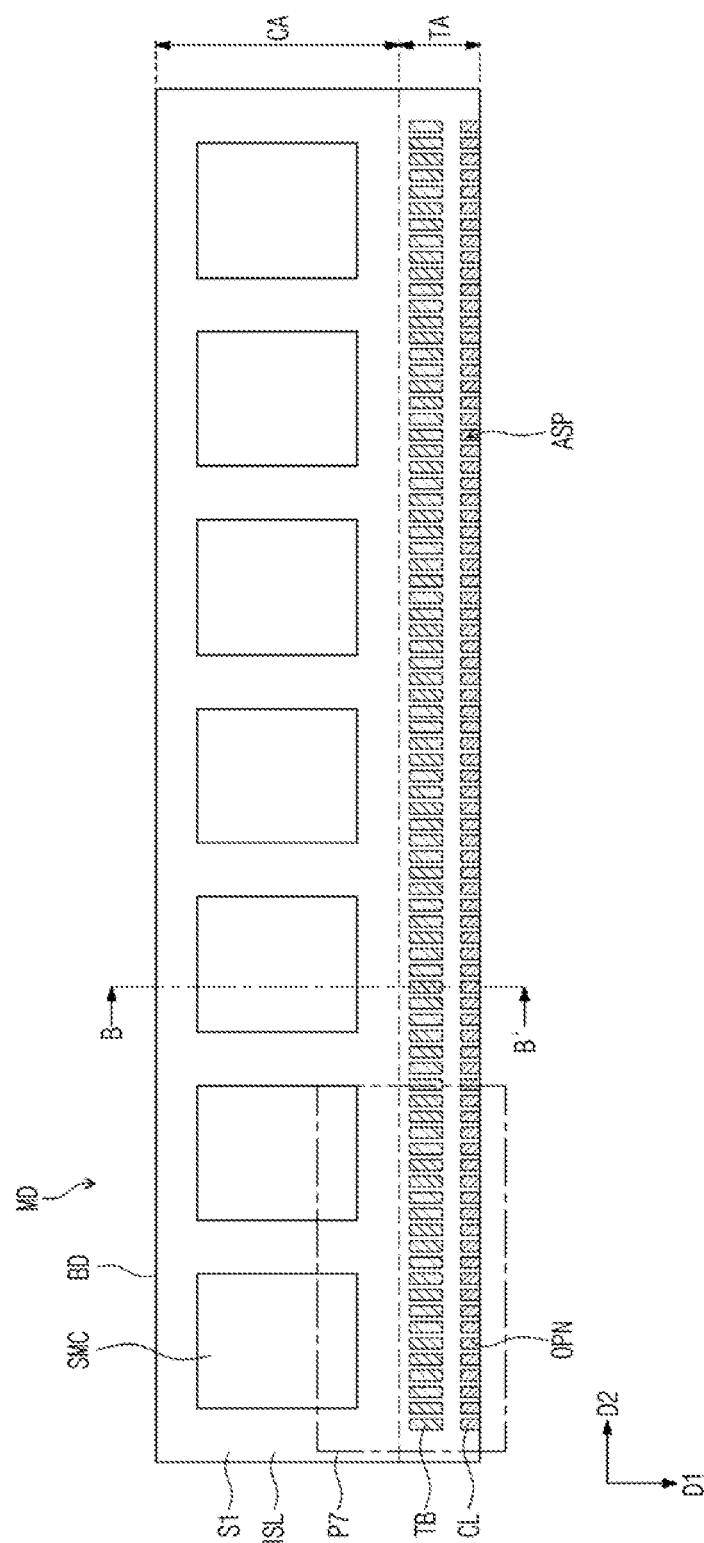
FIG. 8A is a plan view illustrating a semiconductor module according to an embodiment of the disclosure.
Figure 8B:
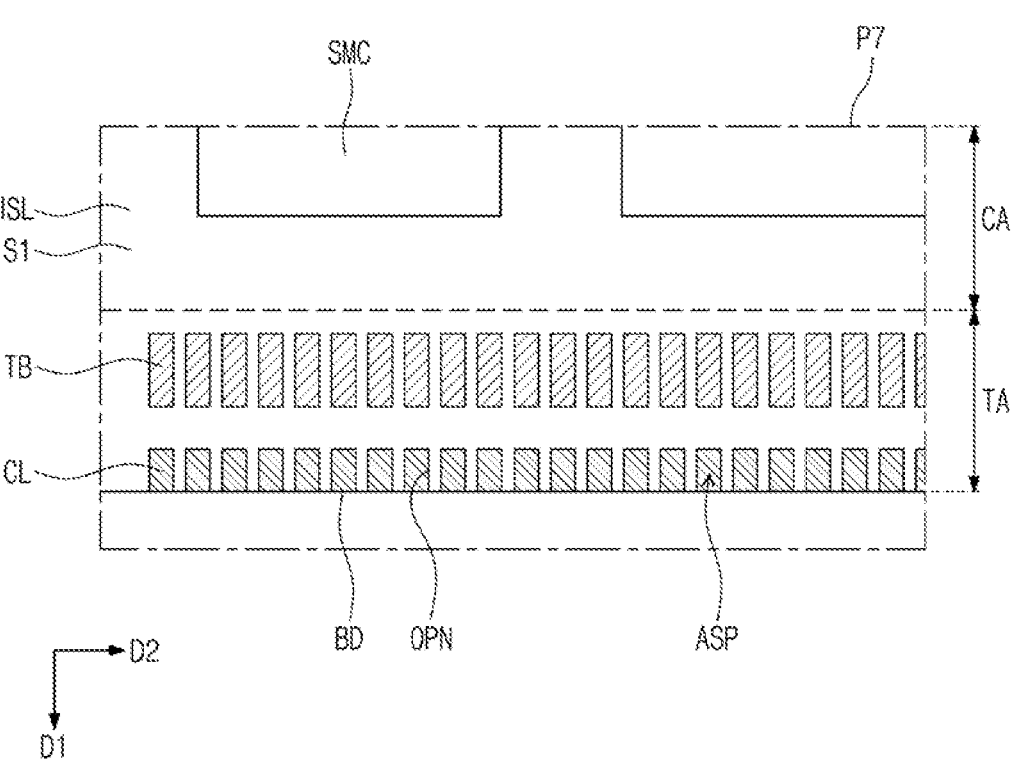
FIG. 8B is an enlarged view of section P7 of FIG. 8A according to an embodiment of the disclosure.
Figure 8C:
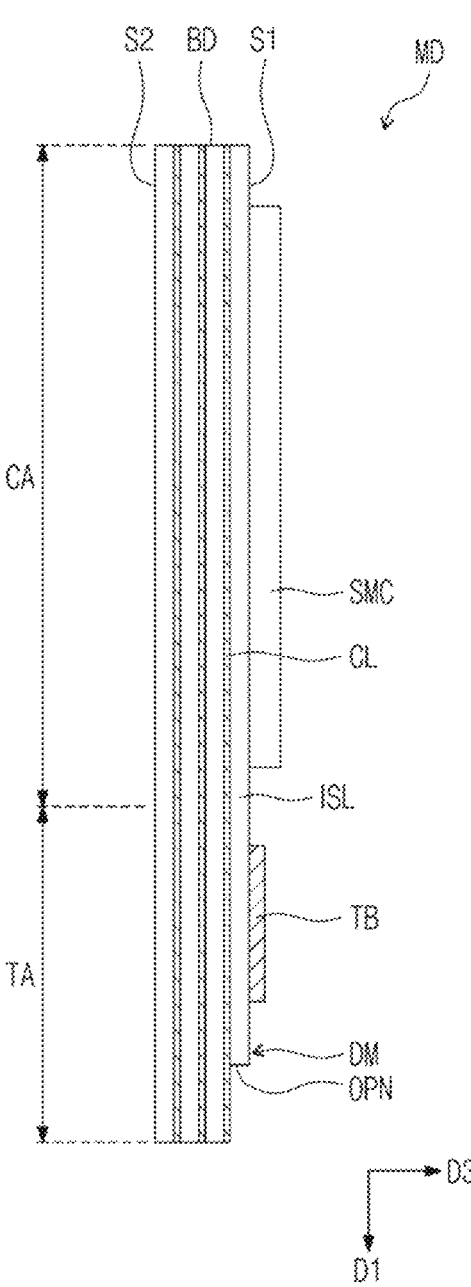
FIG. 8C is a cross-sectional view along line B-B' of FIG. 8A according to an embodiment of the disclosure.

FIG. 8A is a plan view illustrating a semiconductor module according to an embodiment of the disclosure. FIG. 8B is an enlarged view of section P7 of FIG. 8A according to an embodiment of the disclosure. FIG. 8C is a cross-sectional view along line B-B' of FIG. 8A according to an embodiment of the disclosure.

Referring to FIGS. 8A to 8C, the anti-static portion ASP may be provided such that an opening OPN is formed by removing the portion of the board BD and thus a portion of the conductive layer provided therein is exposed to the outside. Although FIG. 8C also illustrates that a portion of the circuit wiring line CL is exposed, this is an example of the conductive layer. That is, as the opening OPN is formed by removing the portion of the board BD, the exposed portion may be a portion of the circuit wiring lines CL or may be another conductive layer provided in a predetermined area regardless of the signal. For example, the conductive layer may be a wiring line which is grounded or to which power is applied, but the present disclosure is not limited thereto. However, in an embodiment, the circuit wiring line CL will be described as an example of the above-described conductive layer.

The board BD may include the circuit wiring line CL having a single layer or a multilayer therein and an insulating layer ISL provided on the circuit wiring line CL. When the circuit wiring line CL has multiple layers, the insulating layer ISL is also provided between two layers of the circuit wiring line CL. The multi-layered circuit wiring line CL may be connected through a plurality of conductive vias provided on the insulating layer ISL.

In an embodiment of the present disclosure, the anti-static portion ASP may be formed by exposing an upper surface of a grounded wiring line to the outside as the opening OPN is formed by removing a portion of the insulating layer ISL corresponding to the upper surface of the grounded wiring line among the circuit wiring line CL to which a grounded voltage is applied. As the semiconductor module MD may include a plurality of openings OPN which may be arranged in the second direction D2. The openings OPN may be provided at an edge positioned on a direction in which the signal tabs TB and the semiconductor module MD are inserted.

In an embodiment of the present disclosure, the openings OPN may be provided in the signal tabs TB, respectively. Alternatively, the number of openings OPN smaller than the number of signal tabs TB to correspond to some of the signal tabs TB. When the openings OPN correspond to some of the signal tabs TB, the openings OPN may be provided at regular intervals. However, the present disclosure is not limited thereto, and an interval at which the openings OPN are arranged may be also differently defined. A larger number of openings OPN may be provided at positions in which the electrostatic discharge frequently occurs. For example, in the semiconductor module MD, when a large amount of electrostatic discharge occurs in a center portion, a larger number of openings OPN may be provided in the center portion, and a smaller number of openings OPN at an edge portion than the number of openings OPN in the center portion may be provided.

Further, the opening OPN may be provided in a bar shape extending in the first direction D1. When the opening OPN has a bar shape extending in the second direction D2, the bar-shaped opening OPN may correspond to the entire portion at which the signal tabs TB are provided or only to portions corresponding to some of the signal tabs TB. Further, the bar-shaped opening OPN may be provided as a plurality of openings OPN. Further, when the plurality of bar-shaped openings OPN are provided, lengths of the bar-shaped openings OPN in the second direction D2 may be the same or different. Further, an interval at which the bar-shaped openings OPN are arranged as well as the lengths of the bar-shaped openings OPN may be also differently defined. The openings OPN may be provided to have a longer length and a narrower interval at a position in which the electrostatic discharge frequently occurs. For example, in the semiconductor module MD, when the electrostatic discharge frequently occurs in the center portion, the bar-shaped opening OPN at the center portion may be provided in a long length, and the bar-shaped opening OPN at the edge portion may be provided in a short length and a wide interval.

When viewing one signal tab TB, the opening OPN may be disposed on the extension line EXL extending from the signal tab TB in the first direction D1 such that the circuit wiring line CL in the opening OPN first contacts the connection pin SKP inside the socket SCK when the semiconductor module MD is inserted into the socket SCK and the signal tab TB then sequentially contacts the connection pin SKP. The circuit wiring line CL exposed by the opening OPN may be separated and spaced apart from the connection pin SKP after the semiconductor module MD is completely inserted into the socket SCK.

In an embodiment of the present disclosure, a chamfer may be used when the anti-static portion ASP is formed such that a portion of the wiring line made of a conductive material is exposed as the opening is formed by removing the portion of the board.

Figure 9A:
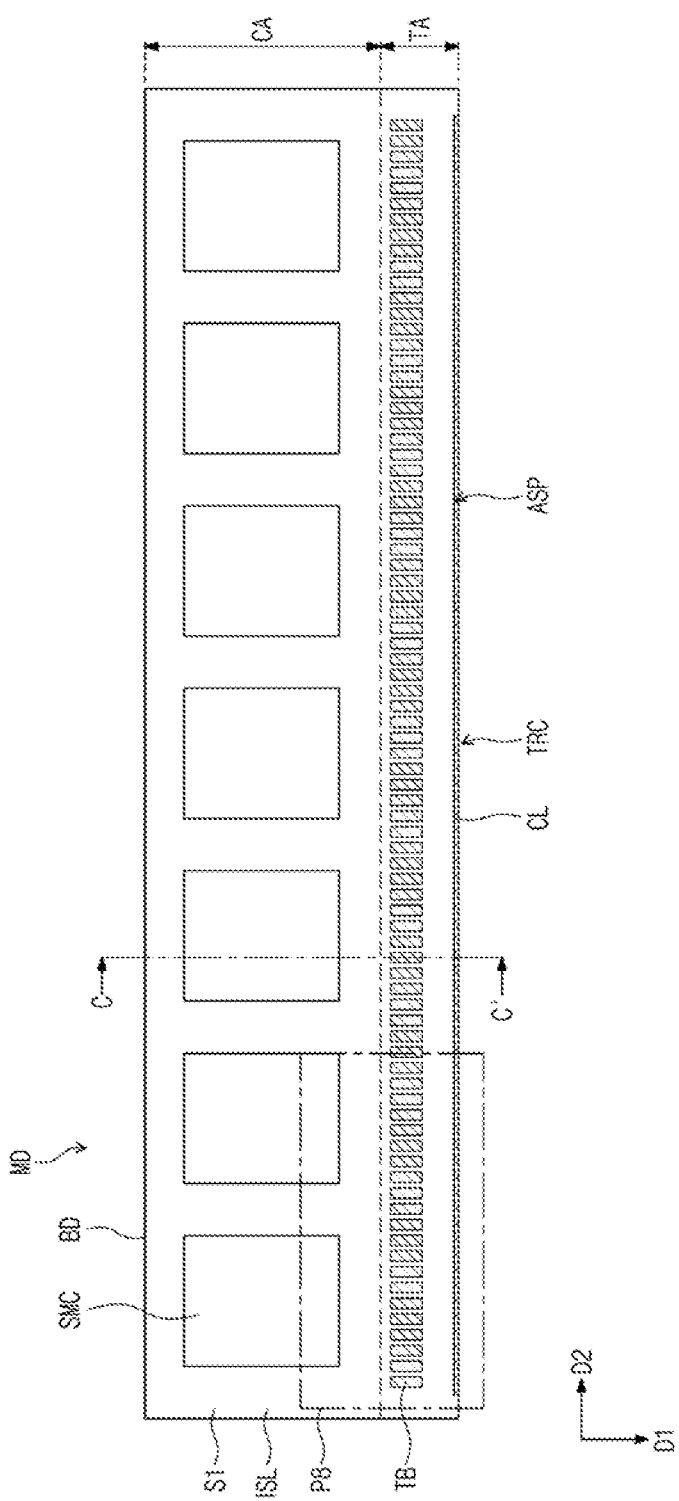
FIG. 9A is a plan view illustrating a semiconductor module according to an embodiment of the disclosure.
Figure 9B:
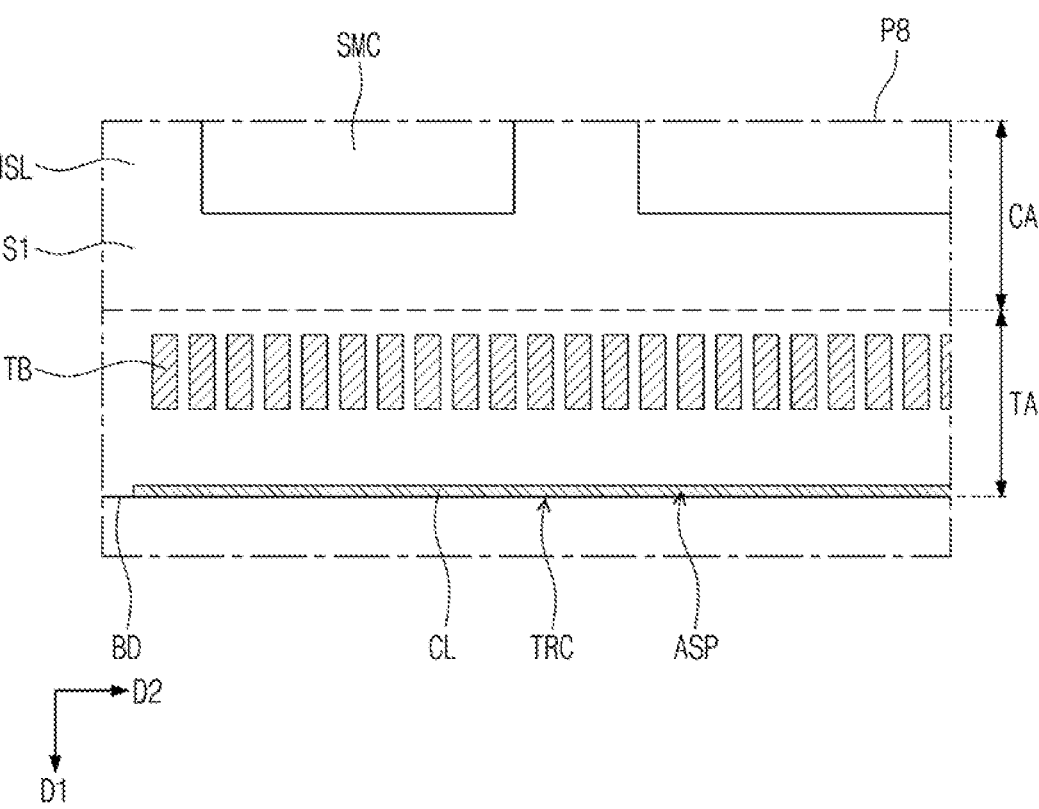
FIG. 9B is an enlarged view of section P8 of FIG. 9A according to an embodiment of the disclosure.
Figure 9C:
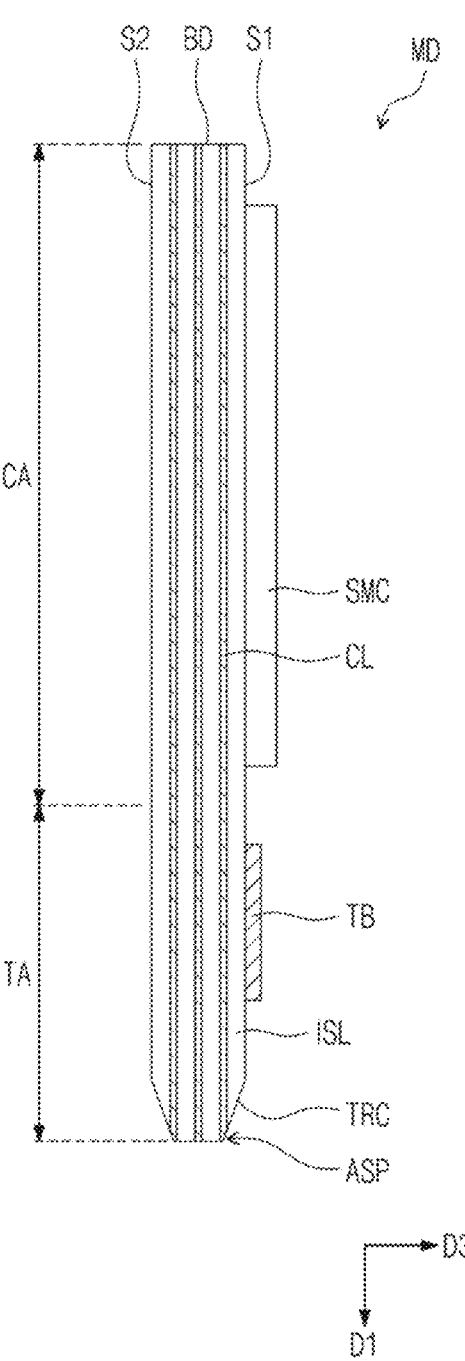
FIG. 9C is a cross-sectional view along line C-C' of FIG. 9A according to an embodiment of the disclosure.

FIG. 9A is a plan view illustrating a semiconductor module according to an embodiment of the disclosure. FIG. 9B is an enlarged view of section P8 of FIG. 9A according to an embodiment of the disclosure. FIG. 9C is a cross-sectional view along line C-C' of FIG. 9A according to an embodiment of the disclosure.

Referring to FIGS. 9A to 9C, the semiconductor module MD may include a chamfer portion TRC that exposes a portion of the circuit wiring line CL to the outside. The chamfer portion TRC may be formed in the insulating layer ISL and may correspond to a corner in a direction in which the board BD is to be inserted (i.e., a corner in a direction in which the signal tab TB is present). During the chamfering, a portion of the insulating layer ISL may be removed until the circuit wiring line CL is exposed to the outside. The chamfer portion TRC may be formed by a chamfering method. In particular, the anti-static portion ASP may expose the grounded wiring line, to which the grounded voltage is applied, among the circuit wiring line CL.

In an embodiment of the present disclosure, the chamfer portion TRC may correspond to the entire edge of the board BD when the chamfer portion TRC is formed by the chamfering method. In this case, the circuit wiring line CL may be exposed to the outside long along the chamfered edge.

In an embodiment of the present disclosure, even when the chamfering method is used, the portion exposed to the outside during the chamfering may be variously deformed by patterning the circuit wiring line CL.

Figure 10A:
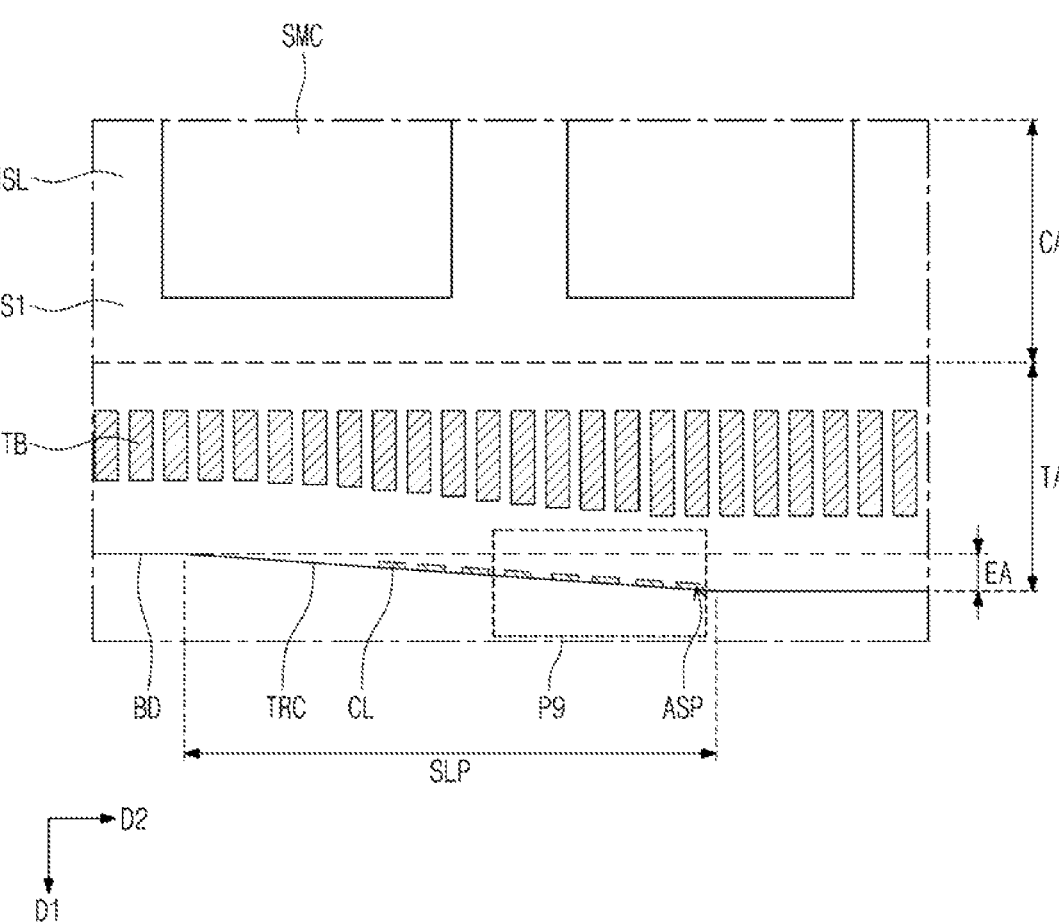
FIG. 10A is an enlarged plan view illustrating a case of a board having an extension area according to an embodiment of the disclosure.
Figure 10B:
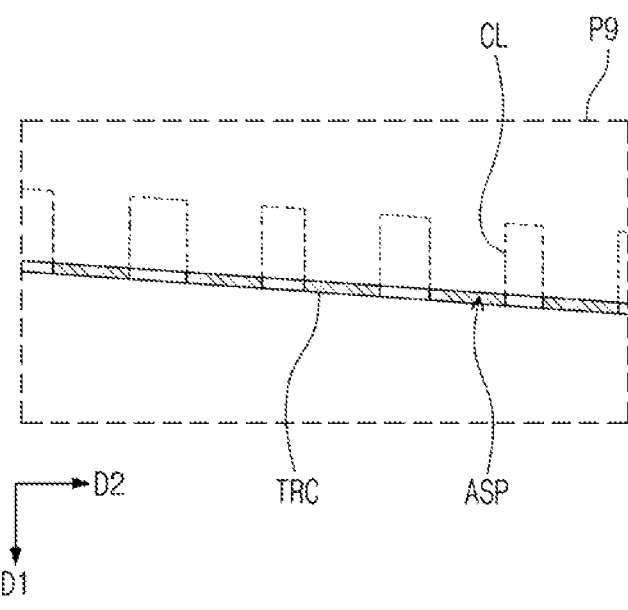
FIG. 10B is an enlarged view of section P9 of FIG. 10A according to an embodiment of the disclosure.

FIG. 10A is an enlarged plan view illustrating a case of a board having an extension area according to an embodiment of the disclosure. FIG. 10B is an enlarged view of section P9 of FIG. 10A according to an embodiment of the disclosure.

Referring to FIGS. 10A and 10B, the chamfered portion TRC may correspond to various areas and may be a portion corresponding to a specific area of the board BD (e.g., the inclined portion SLP of the extension area EA).

The exposed circuit wiring line CL may have a shape of a line that is not separated as illustrated in FIGS. 9A to 9C and may have a shape of a plurality of separated lines as illustrated in FIGS. 10A and 10B. When the exposed circuit wiring line CL includes a plurality of lines, the exposed circuit wiring line CL may be formed by first patterning the circuit wiring line CL to have a protrusion portion and a concave portion, forming the insulating layer ISL, and then chamfering the insulating layer ISL on the circuit wiring line CL.

When viewing one signal tab TB as a reference, in the opening OPN, the circuit wiring line CL exposed by the chambering first contacts the connection pin SKP inside the socket SCK when the semiconductor module MD is inserted into the socket SCK and the signal tab TB then sequentially contacts the connection pin SKP. The circuit wiring line CL exposed by the chamfering may be separated and spaced apart from the connection pin SKP after the semiconductor module MD is completely inserted into the socket SCK.

The anti-static portion ASP of the present disclosure may be manufactured by additionally preparing and coupling a conductive member.

Figure 11A:
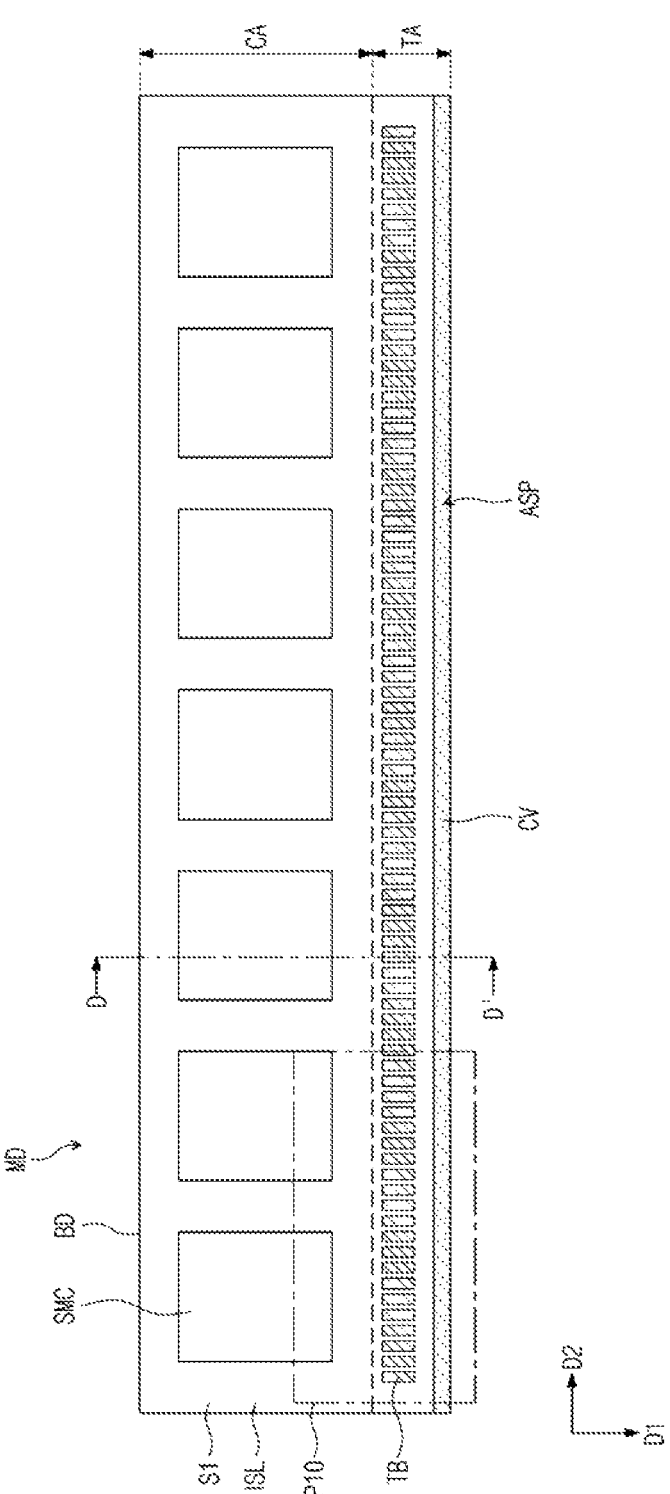
FIG. 11A is a plan view illustrating a semiconductor module according to an embodiment of the disclosure.
Figure 11B:
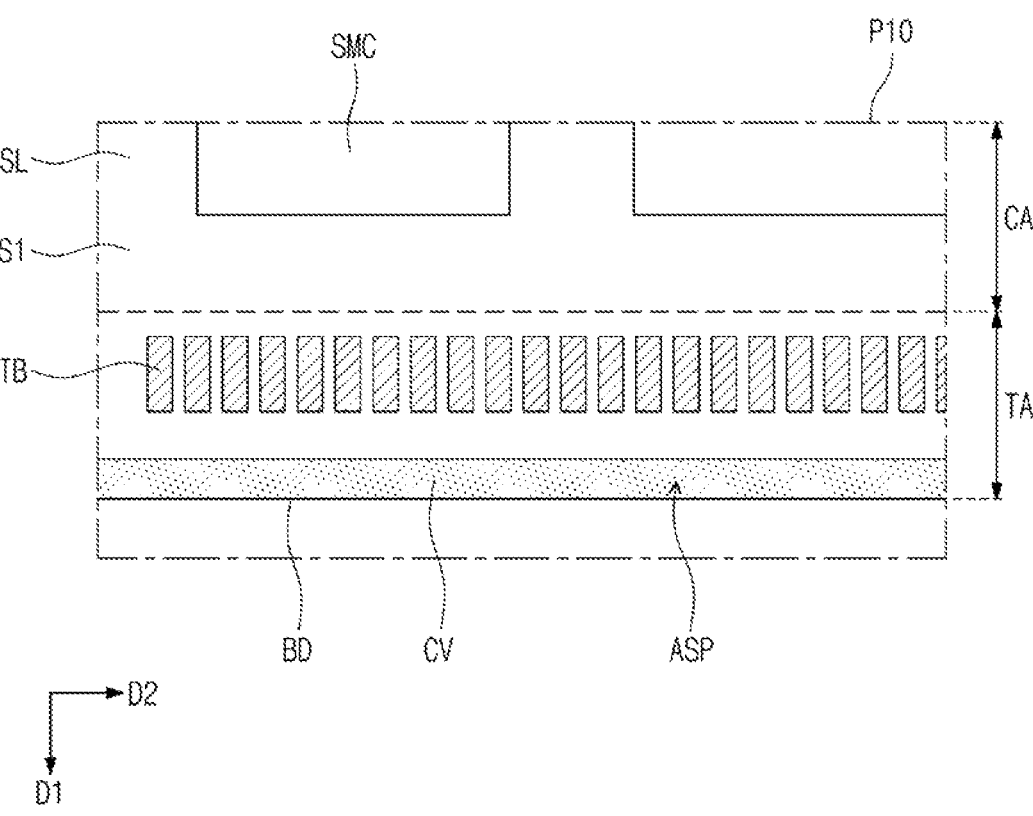
FIG. 11B is an enlarged view of section P10 of FIG. 11A according to an embodiment of the disclosure.
Figure 11C:
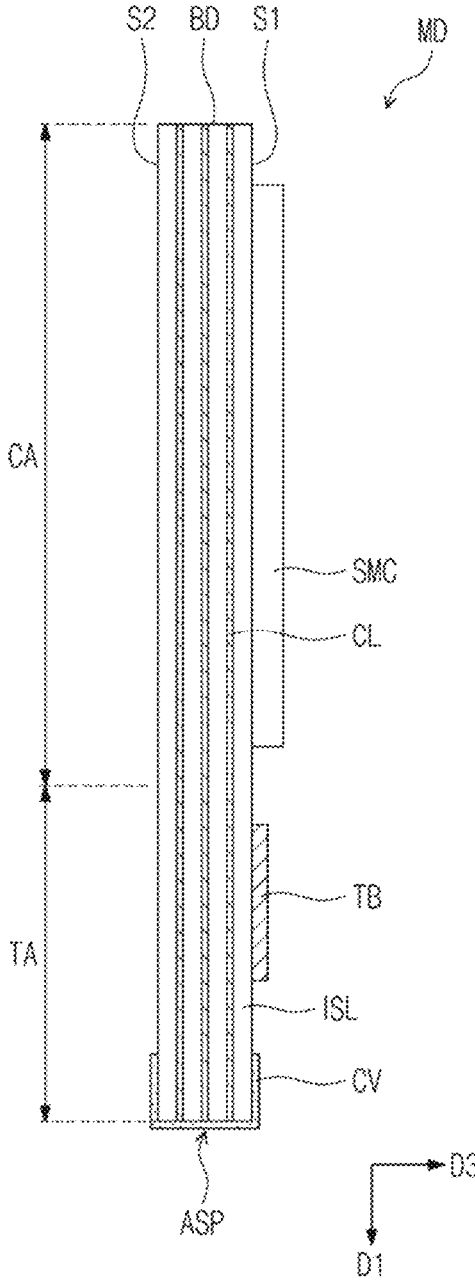
FIG. 11C is a cross-sectional view along line D-D' of FIG. 11A according to an embodiment of the disclosure.

FIG. 11A is a plan view illustrating a semiconductor module according to an embodiment of the disclosure. FIG. 11B is an enlarged view of section P10 of FIG. 11A according to an embodiment of the disclosure. FIG. 11C is a cross-sectional view along line D-D' of FIG. 11A according to an embodiment of the disclosure.

Referring to FIGS. 11A to 11C, the anti-static portion ASP according to an embodiment may be formed by forming a cover portion CV covering the edge of the board BD at positions spaced apart from the signal tabs TB. The cover portion CV may be separately manufactured, and the board BD may be fastened to the cover portion CV in an inserted form.

The cover portion CV may be made of a conductive material (e.g., a metal, a metal alloy, and a conductive polymer).

In an embodiment of the present disclosure, the cover portion CV may cover the entire edge at the insertion side, but the present disclosure is not limited thereto, and the cover portion CV may cover only a portion of the edge. Further, the cover portion CV may be provided as a plurality of cover portions CV which may be provided at regular intervals or random intervals. Further, the cover portion CV may be provided only at a position in which the electrostatic discharge frequently occurs. For example, in the semiconductor module MD, when the electrostatic discharge frequently occurs in the center portion, the cover portion CV may be provided in the center portion and may not be provided in the other portions.

The cover portion CV may be connected to the ground or may be detached.

In the present specification, individual embodiments have been described but may be combined with each other unless the embodiments are compatible with each other. For example, the board having the extension area may be introduced in other embodiments, in which case the anti-static portion may be deformed into a form corresponding to the extension area. Further, the board having the notch or the protrusion portion may be combined with embodiments in which the dummy pattern is provided or embodiments in which an inner wiring line is exposed. In an embodiment, the notch and the protrusion portion may be formed in a state of being spaced apart from each other on the edge of the board. In an embodiment, in a partial area, the anti-static portion may be formed as the dummy pattern, in another partial area, the circuit wiring line may be exposed, and in still another partial area, the cover portion may be formed. In this way, the above-described various embodiments may be combined in various forms.

The semiconductor module having the above-described structure may be mounted on a main board. At least one socket may be installed in the main board, and the semiconductor module is inserted into the socket such that that the semiconductor module may be electrically connected to the main board.

In a semiconductor module according to an embodiment of the present disclosure, when the semiconductor module is inserted into the socket, as electrostatic discharge is prevented, damage is minimized.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor module comprising:
a board comprising a chip area and a tab area sequentially arranged in a first direction;
a semiconductor chip provided on the chip area;
a plurality of signal tabs provided on the tab area and configured to transmit an electrical signal to or receive an electrical signal from the semiconductor chip; and
at least one anti-static portion having conductivity, the at least one anti-static portion being provided in the tab area and spaced apart from the plurality of signal tabs,
wherein the plurality of signal tabs and the at least one anti-static portion are sequentially arranged in the first direction, and
wherein the at least one anti-static portion is disposed on a line extending from at least one of the plurality of signal tabs in the first direction.

2. The semiconductor module of claim 1, wherein the at least one anti-static portion comprises a plurality of anti-static portions respectively corresponding to the plurality of signal tabs.

3. The semiconductor module of claim 1, wherein the at least one anti-static portion comprises a plurality of anti-static portions, and
wherein the plurality of anti-static portions correspond to at least one of the plurality of signal tabs.

4. The semiconductor module of claim 1, wherein the at least one anti-static portion extends in a second direction intersecting the first direction.

5. The semiconductor module of claim 1, wherein the tab area comprises an extension area extending in the first direction.

6. The semiconductor module of claim 5, wherein at least a portion of the at least one anti-static portion is provided inside the extension area.

7. The semiconductor module of claim 6, wherein an edge of the extension area comprises an inclined portion that is inclined in the first direction, and
wherein the at least one anti-static portion is provided inside the inclined portion.

8. The semiconductor module of claim 1, wherein the at least one anti-static portion is configured to float or to be grounded.

9. The semiconductor module of claim 1, wherein the plurality of signal tabs are configured to be connected to a connection pin inside a socket upon insertion of the semiconductor module into the socket in the first direction.

10. The semiconductor module of claim 9, wherein the at least one anti-static portion is configured to, after insertion of the semiconductor module into the socket, be spaced apart from the connection pin.

11. The semiconductor module of claim 9, wherein the at least one anti-static portion is configured to, upon insertion of the semiconductor module into the socket, contact a conductor inside the socket prior to the plurality of signal tabs being connected to the socket.

12. The semiconductor module of claim 1, wherein the at least one anti-static portion and the plurality of signal tabs comprise a same material.

13. The semiconductor module of claim 1, wherein the at least one anti-static portion comprises at least one dummy pattern provided between the plurality of signal tabs and an edge of the board.

14. The semiconductor module of claim 1, wherein the board further comprises a conductive layer, and
wherein the at least one anti-static portion is configured such that at least a portion of the conductive layer is exposed to an outside.

15. The semiconductor module of claim 1, wherein the board further comprises a conductive layer and an insulating layer provided on the conductive layer, and
wherein at least a portion of the conductive layer is exposed through at least one opening in the insulating layer.

16. The semiconductor module of claim 1, wherein the board further comprises:
a conductive layer; and
an insulating layer provided on the conductive layer,
wherein the insulating layer comprises a chamfer portion, and
wherein a portion of the conductive layer is exposed by the chamfer portion.

17. The semiconductor module of claim 1, wherein the at least one anti-static portion comprises a cover portion configured to at least partially cover an edge of the board.

18. A semiconductor module comprising:
a board comprising:
a chip area and a tab area sequentially arranged in a first direction, and
at least one notch or at least one protrusion in the tab area;
a semiconductor chip provided on the chip area;
a plurality of signal tabs provided on the tab area and configured to transmit an electrical signal to or receive an electrical signal from the semiconductor chip; and
an anti-static portion having conductivity, the anti-static portion being provided in the tab area, and spaced apart from the plurality of signal tabs,
wherein the anti-static portion is provided either adjacent to the at least one notch or on the at least one protrusion.

19. A semiconductor module configured to be inserted into a socket in a first direction, the semiconductor module comprising:
a board comprising a chip area and a tab area sequentially arranged in the first direction;
a semiconductor chip provided on the chip area;
a plurality of signal tabs provided on the tab area; and an anti-static portion having conductivity, the anti-static portion being provided in the tab area and spaced apart from the plurality of signal tabs, wherein the plurality of signal tabs and the anti-static portion are sequentially arranged in the first direction, and wherein the anti-static portion and the plurality of signal tabs are configured to sequentially contact a connection pin inside the socket upon insertion of the semiconductor module into the socket.

20. The semiconductor module of claim 19, wherein the anti-static portion further configured to, after the anti-static portion is inserted into the socket, be spaced apart from the connection pin.

* * * * *